US010978152B1

(12) United States Patent
Gautam et al.

(10) Patent No.: US 10,978,152 B1
(45) Date of Patent: *Apr. 13, 2021

(54) ADAPTIVE VPASS FOR 3D FLASH MEMORY WITH PAIR STRING STRUCTURE

(71) Applicant: SANDISK TECHNOLOGIES LLC, Addison, TX (US)

(72) Inventors: Rajdeep Gautam, Yokohama (JP); Hardwell Chibvongodze, Hiratsuka (JP); Ken Oowada, Fujisawa (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/682,730

(22) Filed: Nov. 13, 2019

(51) Int. Cl.
| G11C 16/04 | (2006.01) |
| G11C 16/10 | (2006.01) |
| G11C 16/28 | (2006.01) |
| G11C 11/56 | (2006.01) |
| G11C 16/34 | (2006.01) |

(52) U.S. Cl.
CPC ...... *G11C 16/0483* (2013.01); *G11C 11/5635* (2013.01); *G11C 16/10* (2013.01); *G11C 16/28* (2013.01); *G11C 16/3427* (2013.01)

(58) Field of Classification Search
CPC . G11C 16/0483; G11C 16/10; G11C 16/3427; G11C 16/28; G11C 11/5635
USPC .................................................. 365/185.17
See application file for complete search history.

(56) References Cited

U.S. PATENT DOCUMENTS

| 9,123,424 | B2 | 9/2015 | Dowada |
| 9,286,987 | B1 | 3/2016 | Dong |
| 9,430,376 | B2 | 4/2016 | Horn |
| 9,446,369 | B2 | 10/2016 | Pang |
| 9,583,198 | B1 | 2/2017 | Pang |
| 9,953,717 | B2 | 4/2018 | Sabde |
| 10,832,777 | B2 * | 11/2020 | Shiino ................ G11C 16/14 |
| 10,839,913 | B2 * | 11/2020 | Maejima ............. G11C 16/26 |
| 2009/0273980 | A1 | 11/2009 | Doyle |
| 2012/0140568 | A1 | 6/2012 | Dutta |
| 2012/0250414 | A1 | 10/2012 | Khandelwal |

(Continued)

OTHER PUBLICATIONS

Chibvongodze, et al., "Sub-Block Size Reduction for 3D Non-Volatile Memory," U.S. Appl. No. 16/432,304, filed Jun. 5, 2019.

(Continued)

*Primary Examiner* — Fernando Hidalgo
(74) *Attorney, Agent, or Firm* — Vierra

(57) ABSTRACT

Systems and methods for reducing program disturb when programming portions of a memory array are described. A memory array may include a first set of NAND strings and a second set of NAND strings that share a common bit line that is connected to the drain-side end of drain-side select gates of the NAND strings and/or share a common source-side select gate line that connects to the gates of source-side select gates of the NAND strings. During programming of the first set of NAND strings a first pass voltage (e.g., 7V) may be applied to unselected word lines of the memory array and subsequently during programming of the second set of NAND strings a second pass voltage (e.g., 9V) greater than the first pass voltage may be applied to the unselected word lines of the memory array.

20 Claims, 21 Drawing Sheets

(56) References Cited

U.S. PATENT DOCUMENTS

| | | | |
|---|---|---|---|
| 2012/0275232 A1 | 11/2012 | Park | |
| 2013/0235671 A1 | 9/2013 | Lee | |
| 2019/0252023 A1* | 8/2019 | Lee | G11C 5/02 |
| 2020/0020404 A1* | 1/2020 | Kim | G11C 16/12 |
| 2020/0143883 A1* | 5/2020 | Joo | G11C 16/32 |
| 2020/0303013 A1* | 9/2020 | Maeda | G11C 16/26 |

OTHER PUBLICATIONS

PCT International Search Report dated Jul. 31, 2020, PCT Patent Application No. PCT/US2020/025570.
PCT Written Opinion of the International Searching Authority dated Jul. 31, 2020, PCT Patent Application No. PCT/US2020/025570.
Office Action dated Aug. 17, 2020, U.S. Appl. No. 16/912,720.
Gautam et al., "Adaptive VPASS for 3D Flash Memory with Pair String Structure," U.S. Appl. No. 16/912,720, filed Jun. 26, 2020.
Notice of Allowance dated Jan. 22, 2021, U.S. Appl. No. 16/912,720.

\* cited by examiner

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

ADAPTIVE VPASS FOR 3D FLASH MEMORY WITH PAIR STRING STRUCTURE

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM typically utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. In recent years, NAND flash memory has been scaled in order to reduce cost per bit. However, as process geometries shrink, many design and process challenges are presented. These challenges include increased variability in memory cell characteristics over process, voltage, and temperature and increased program disturb.

BRIEF DESCRIPTION OF THE DRAWINGS

Like-numbered elements refer to common components in the different figures.

DETAILED DESCRIPTION

Figure 1:
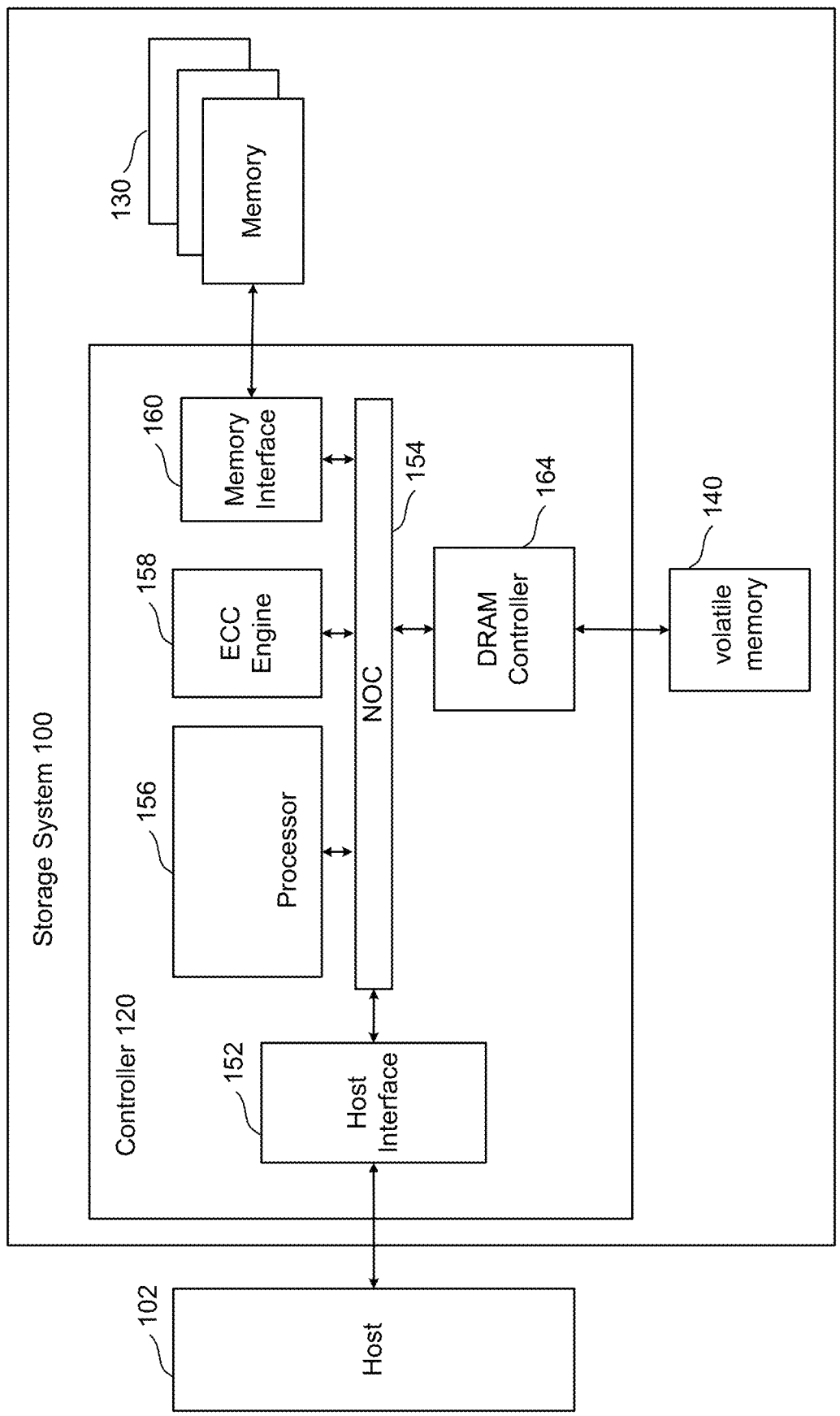
FIG. 1 is a block diagram depicting one embodiment of a memory system.

Technology is described for reducing program disturb when programming portions of a memory array, such as when programming a sub-block or a subset of NAND strings within a three-dimensional non-volatile memory array. The memory array may include strings of memory cells (e.g., vertical NAND strings) and be fabricated using buried source lines such that sub-blocks or sets of strings within the memory array may be individually selected or unselected in both a horizontal direction (e.g., the word line direction) and a vertical direction (e.g., the vertical NAND string direction). A memory array may include a first set of NAND strings and a second set of NAND strings. The first set of NAND strings and the second set of NAND strings may share a common bit line that is connected to the drain-side end of drain-side select gates of the NAND strings and/or share a common source-side select gate line that connects to the gates of source-side select gates of the NAND strings. The first set of NAND strings may comprise a first group of memory cells and the second set of NAND strings may comprise a second group of memory cells. During programming of the first group of memory cells a first pass voltage (e.g., 7V) may be applied to unselected word lines of the memory array and subsequently during programming of the second group of memory cells a second pass voltage (e.g., 9V) greater than the first pass voltage may be applied to the unselected word lines of the memory array. In this case, the application of the second pass voltage during the programming of the second group of memory cells may reduce the amount of program disturb affecting the first group of memory cells.

The magnitude of the increase in the second pass voltage from the first pass voltage may depend on the total number of memory cells within the first group of memory cells, the total number of sets of strings within the memory array, the number of program/erase cycles experienced by the first group of memory cells, the temperature difference between the programming of the first group of memory cells and the programming of the second group of memory cells, and/or the amount of time between the programming of the first group of memory cells and the programming of the second group of memory cells. In one example, the magnitude of the increase for the second pass voltage may be set to a second voltage (e.g., 2V) if there are only two different sets of NAND strings; however, the magnitude of the increase for the second pass voltage may be set to a first voltage (e.g., 1V) less than the second voltage if there are more than two different sets of NAND strings. In another example, if the number of program/erase cycles for the first group of memory cells is less than five, then the magnitude of the increase for the second pass voltage may be set to a second voltage (e.g., 2V); however, if the number of program/erase cycles for the first group of memory cells is equal to or greater than five, then the magnitude of the increase for the second pass voltage may be set to a first voltage (e.g., 1V) less than the second voltage. In another example, the magnitude of the increase for the second pass voltage may be set to a second voltage (e.g., 2V) if the first set of NAND strings comprises two NAND strings; however, the magnitude of the increase for the second pass voltage may be set to a first voltage (e.g., 1V) less than the second voltage if the first set of NAND strings comprises more than two NAND strings. One technical benefit of adaptively increasing the magnitude of subsequent pass voltages applied to unselected word lines as subsequent sets of NAND strings are programmed is that program disturb may be reduced and power consumption may be minimized overall compared with applying a single pass voltage when programming all of the sets of NAND strings within a memory array.

In one embodiment, a memory array may comprise four NAND strings with a first group of NAND strings comprising two NAND strings and a second group of NAND strings comprising two NAND strings. During programming of the first group of NAND strings, a pass voltage of a first voltage magnitude (e.g., 8V) may be applied; during programming of the second group of NAND strings, a pass voltage of a second voltage magnitude (e.g., 10V) greater than the first voltage magnitude may be applied. In another embodiment, a memory array may comprise four NAND strings with a first group of NAND strings comprising three NAND strings and a second group of NAND strings comprising the remaining NAND string. During programming of the first group of NAND strings, a pass voltage of a first voltage magnitude (e.g., 8V) may be applied; during programming of the second group of NAND strings, a pass voltage of a third voltage magnitude (e.g., 9V) greater than the first voltage magnitude but less than the second voltage magnitude may be applied. In this case, the pass voltage applied during programming of the second group of NAND strings for the 2:2 NAND strings grouping may be greater than the pass voltage applied for the 3:1 NAND strings grouping. One reason for the reduction in the pass voltage applied during programming of the second group of NAND strings for the 3:1 NAND strings grouping is that as the number of memory cells within the second group of NAND strings reduces, the amount of time during which the memory cells of the first group of NAND strings experience voltage stress also reduces.

In another embodiment, a memory array may comprise a first group of NAND strings and a second group of NAND strings. Upon detection that the first group of NAND strings has experienced program disturb (e.g., by detecting a bit error within data stored using the first group of NAND strings), a controller for programming the memory array may adjust (e.g., reduce) the number of NAND strings within the second group of NAND strings and/or increase the pass voltage applied during programming of the second group of NAND strings. In one example, upon detection that the first group of NAND strings has experienced program disturb, the controller may reduce the number of NAND strings within the second group of NAND strings from two NAND strings to one NAND string. In another example, upon detection that the first group of NAND strings has experienced program disturb, the controller may increase the pass voltage applied during programming of the second group of NAND strings by 200 mV.

In some programming methods, memory cells connected to the same word line within a memory array are programmed across all NAND strings while the same pass voltage is applied to the unselected word lines. With an adaptive pass voltage method, the pass voltage applied to a first group of memory cells within a first group of NAND strings that are connected to a first word line is different from the pass voltage applied to a second group of memory cells within a second group of NAND strings that are connected to the same first word line. In one embodiment, if a bit error is detected within the first group of memory cells (e.g., caused by program disturb), then the second group of memory cells may be partitioned into two groups of memory cells in order to reduce the number of memory cells within each group. In one example, the second group of memory cells may correspond with four NAND strings, which may be partitioned into two groups of two NAND strings.

A memory array may be fabricated using buried source lines such that sub-blocks within the memory array may be individually selected or unselected in both a horizontal direction (e.g., the word line direction) and a vertical direction (e.g., the vertical NAND string direction). The memory array may include a plurality of sub-blocks that are individually selectable and that share bit lines and/or source-side select gate lines. The memory array may include a plurality of sub-blocks that are individually selectable that comprise different portions of the same NAND string in which a first sub-block of the plurality of sub-blocks connects to a drain-side select gate for the NAND string and a second sub-block of the plurality of sub-blocks connects to a source-side select gate for the NAND string. In one example, the memory array may include four sub-blocks, wherein two sub-blocks of the four sub-blocks are arranged vertically within the physical memory block (e.g., a first sub-block of the two sub-blocks is physically formed above a second sub-block of the two sub-blocks) and wherein a first portion of the NAND string corresponds with a first sub-block of the two sub-blocks and a second portion of the NAND string corresponds with a second sub-block of the two sub-blocks.

One technical issue with increasing the string lengths of vertical NAND strings or increasing the number of word line layers per physical memory block is that the overall size of the physical memory block will also increase (e.g., from 9 MB to 36 MB). The larger memory block size may make garbage collection inconvenient and reduce memory block yields due to an increased number of bad blocks. One technical benefit of using two or more buried source lines per physical memory block is that smaller sub-blocks within the physical memory block may be individually selected and unselected leading to improved block yields and garbage collection.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

FIG. 1 is a block diagram of one embodiment of a memory system 100 that implements the proposed technology, including countermeasures for avoiding unrecoverable errors due to over programming. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below. Local high speed volatile memory 140 is used by controller 120 to perform certain functions. For example, local high speed volatile memory 140 stores logical to physical address translation tables ("L2P tables").

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
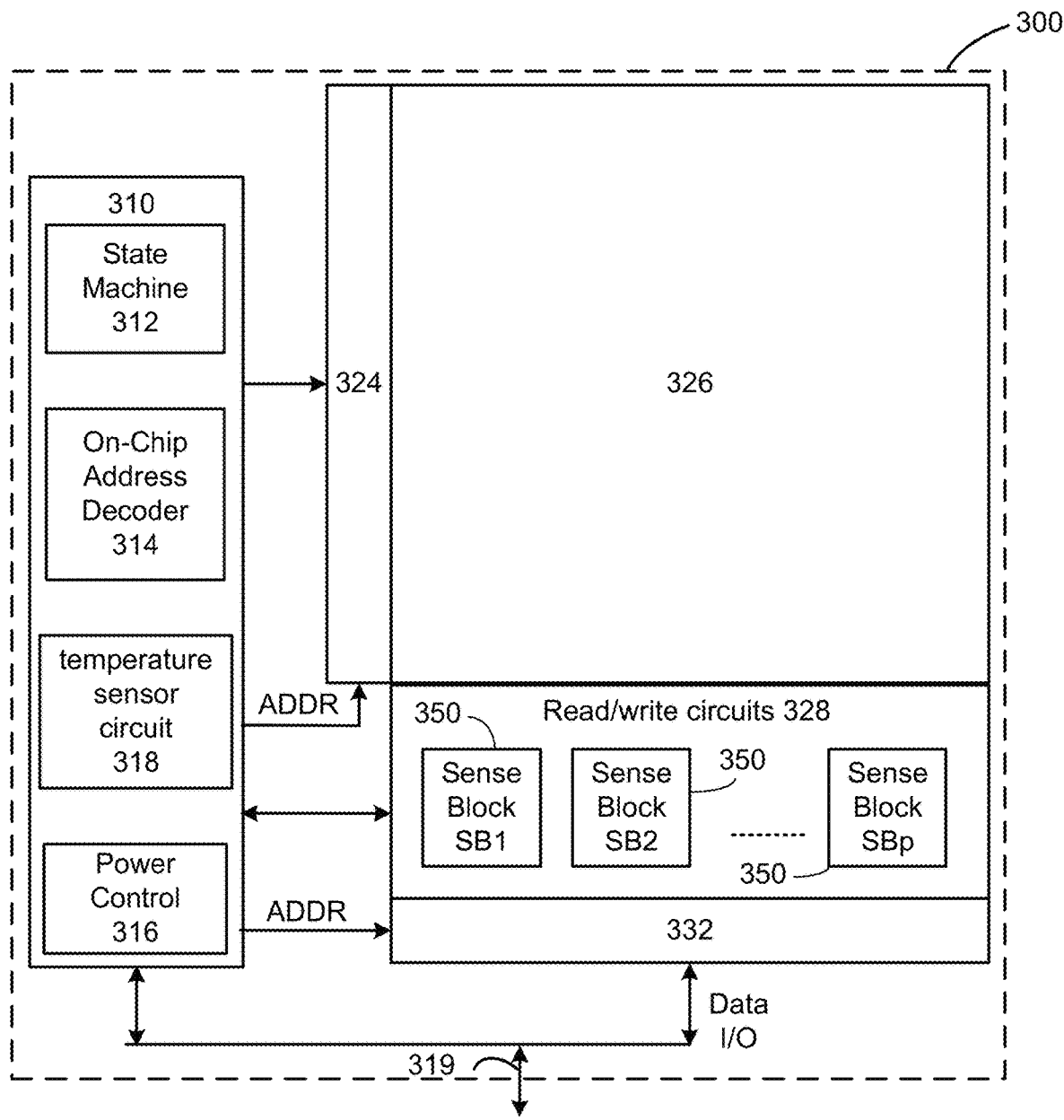
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers. Commands and data are transferred between the controller and the memory die 300 via lines 319. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature sensor circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a programmable microcontroller or microprocessor. In one embodiment, control circuitry 310 includes buffers such as registers, ROM fuses and other storage devices for storing default values such as base voltages and other parameters. Temperature sensor circuit 318 detects current temperature at memory die 300.

In some embodiments, one or more of the components (alone or in combination) within the memory die 300 may be referred to as a managing or control circuit. For example, one or more managing or control circuits may include any one of or a combination of control circuitry 310, state machine 312, decoder 314, power control 316, sense blocks 350, or read/write circuits 328. The one or more managing circuits or the one or more control circuits may perform or facilitate one or more memory array operations including erasing, programming, or reading operations.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise one embodiment of a control circuit for memory structure 326. In other embodiments, other circuits that support and operate on memory structure 326 can be referred to as a control circuit. For example, in some embodiments, the controller can operate as the control circuit or can be part of the control circuit. In some embodiments, the controller in combination with control circuitry 310, read/write circuits 328 and decoders 324/332 comprise one embodiment of a control circuit. In another embodiment, state machine 312 comprises the control circuit. In another embodiment, the host can provide the control circuit.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ferroelectric memories (FeRAM or FeFET), ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge2Sb2Te5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
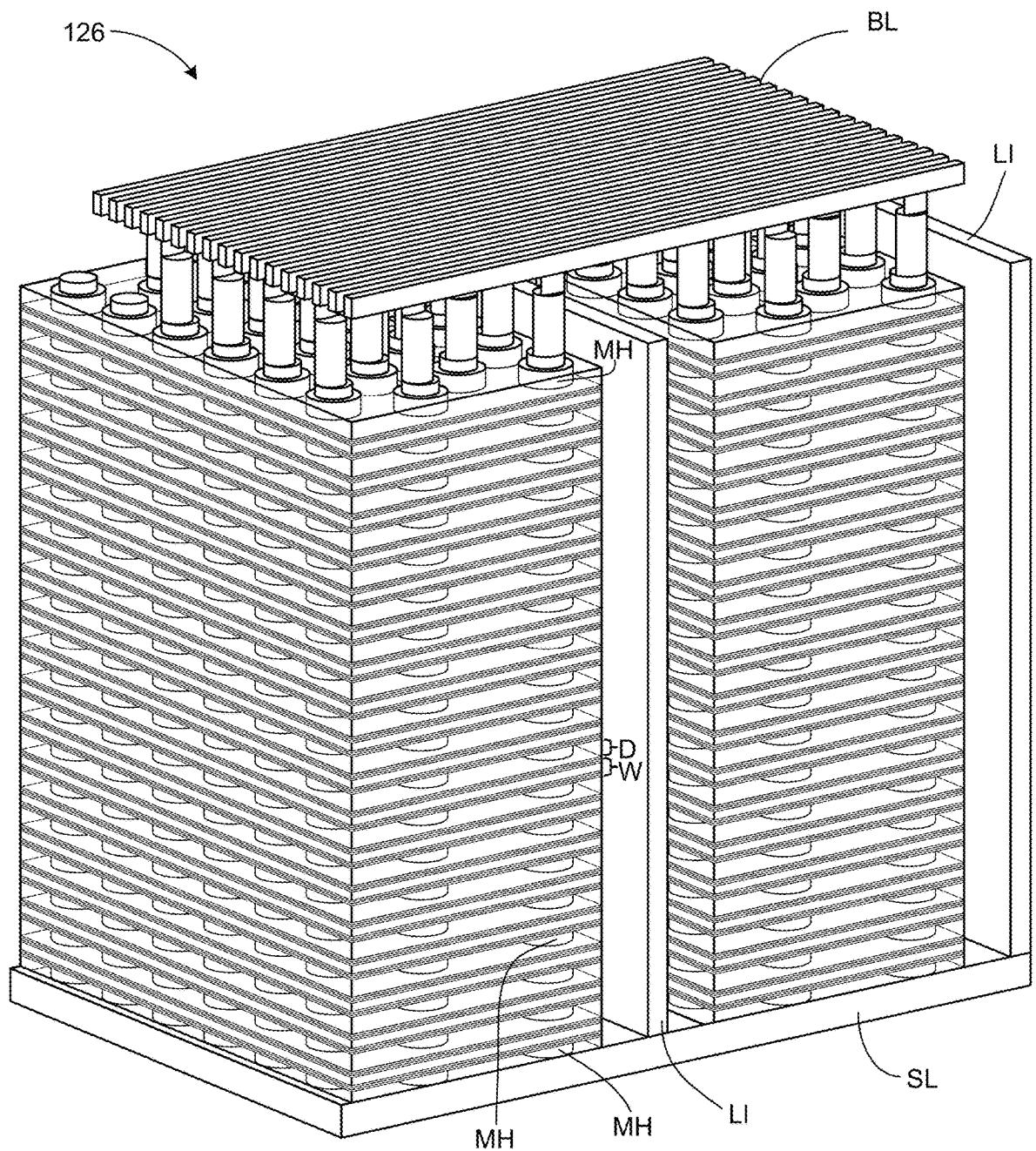
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4F.

Figure 4A:
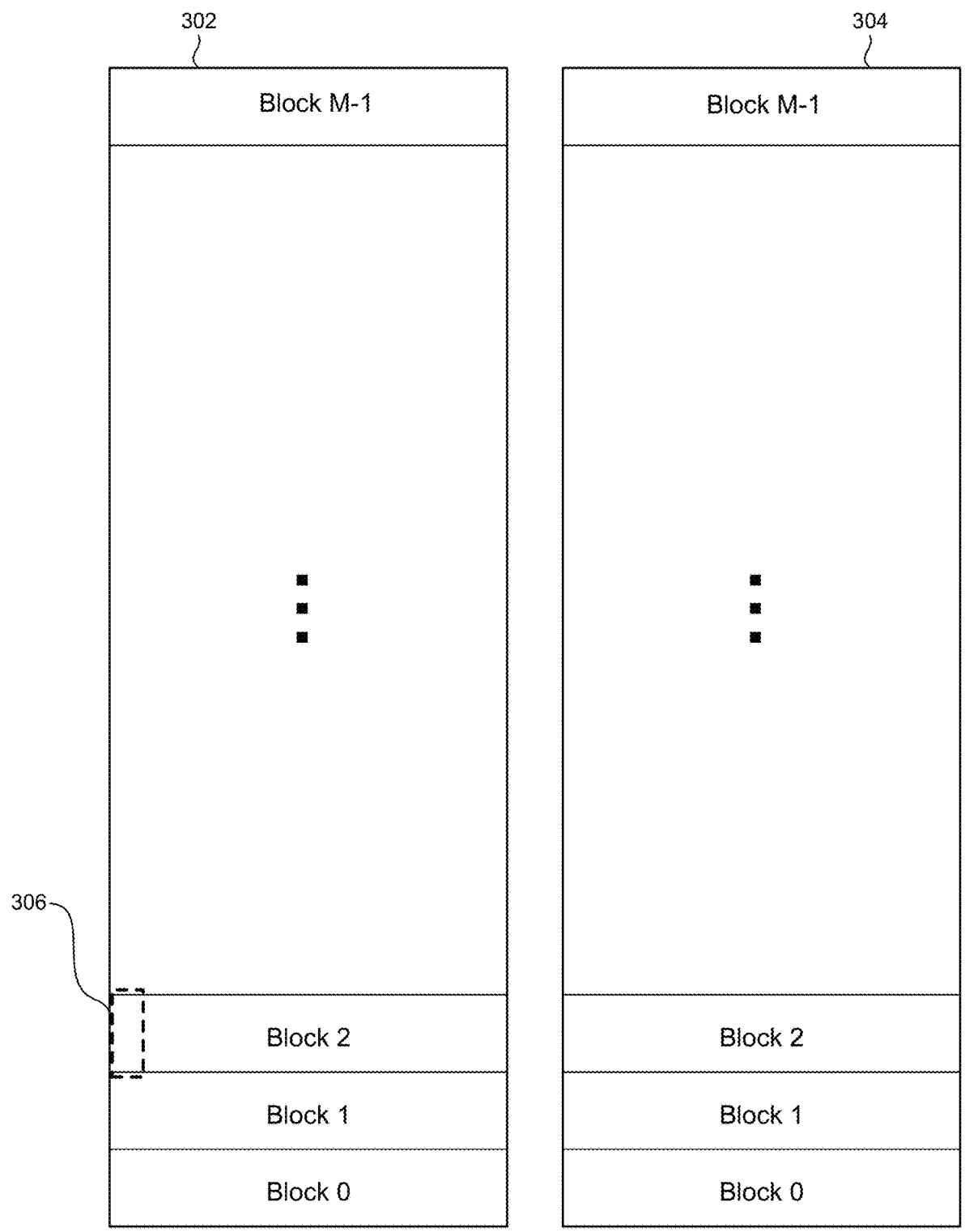
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
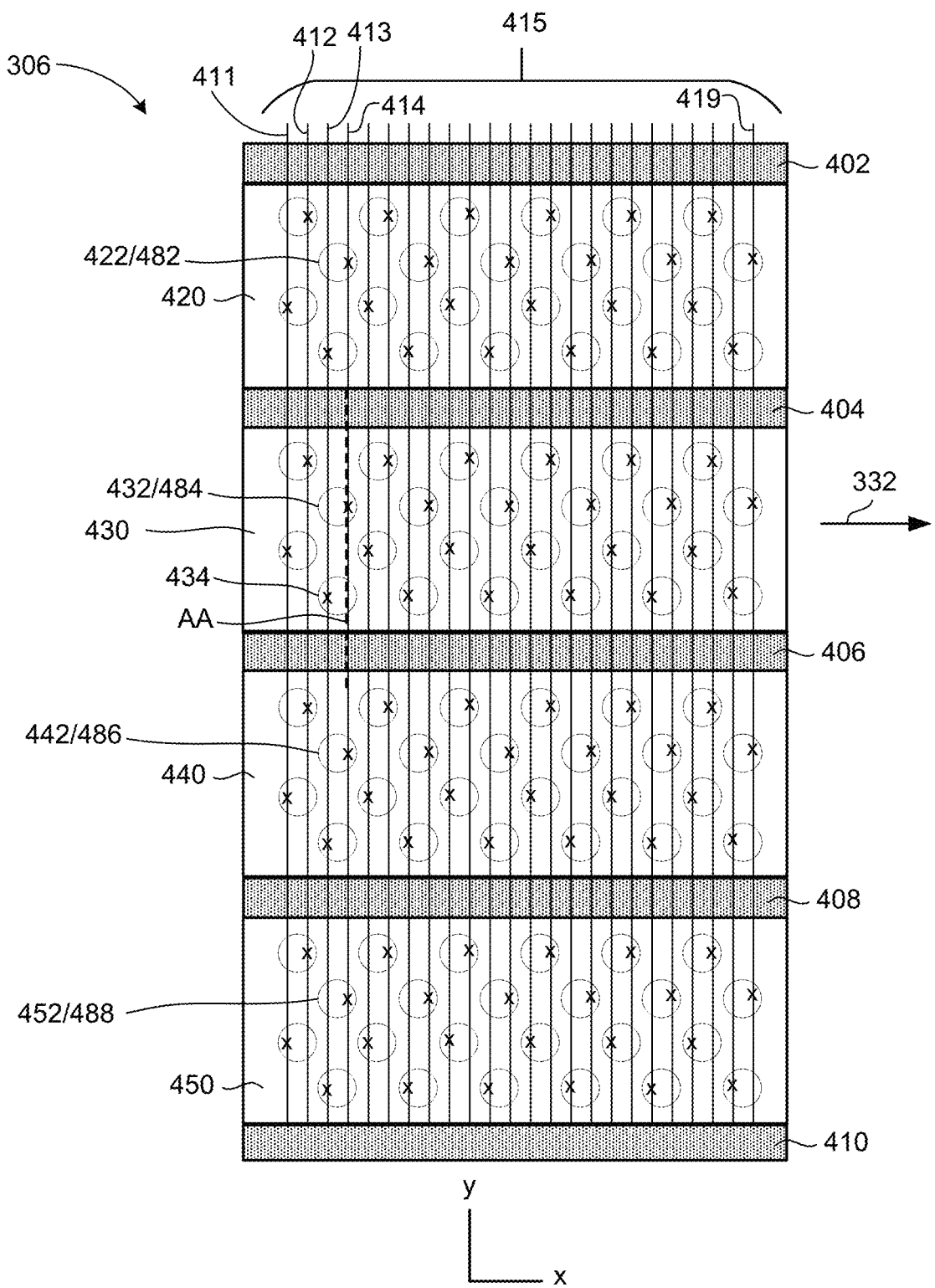
FIG. 4B depicts a top view of a portion of a block of memory cells.

FIGS. 4B-4F depict an example three dimensional ("3D") NAND structure that corresponds to the structure of FIG. 3 and can be used to implement memory structure 326 of FIG. 2. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
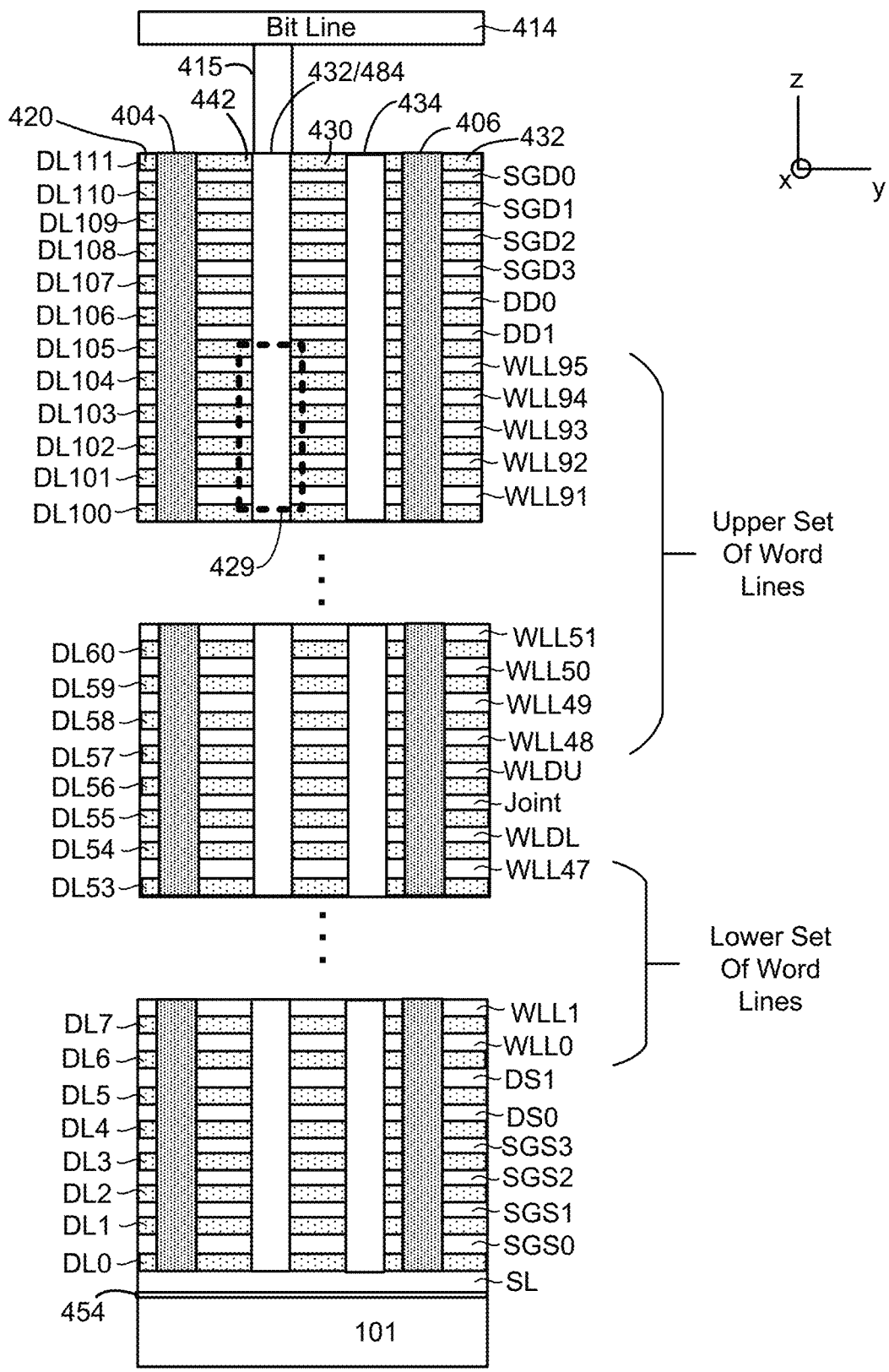
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
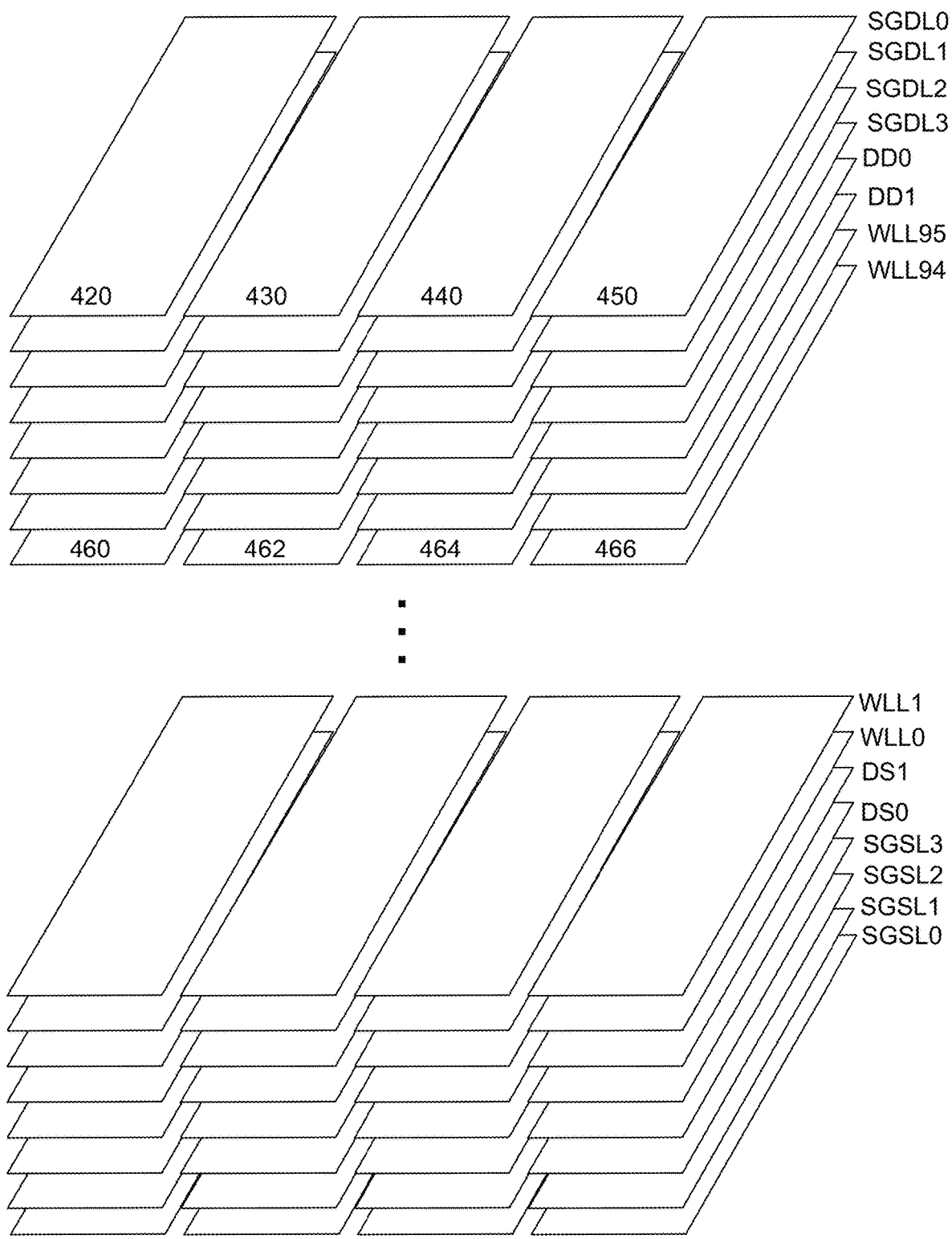
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
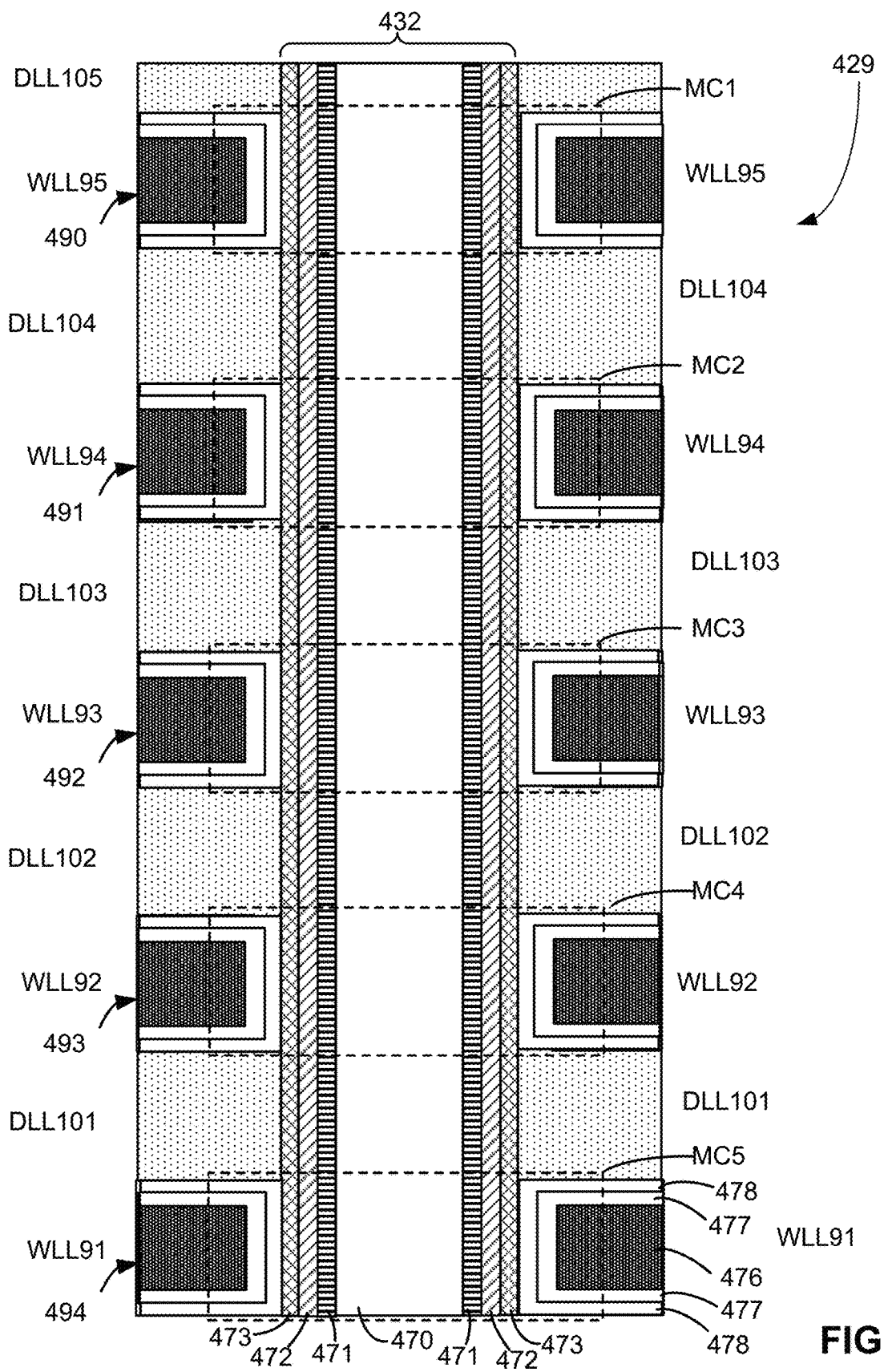
FIG. 4E is a cross sectional view of a vertical column of memory cells.

FIG. 4E depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
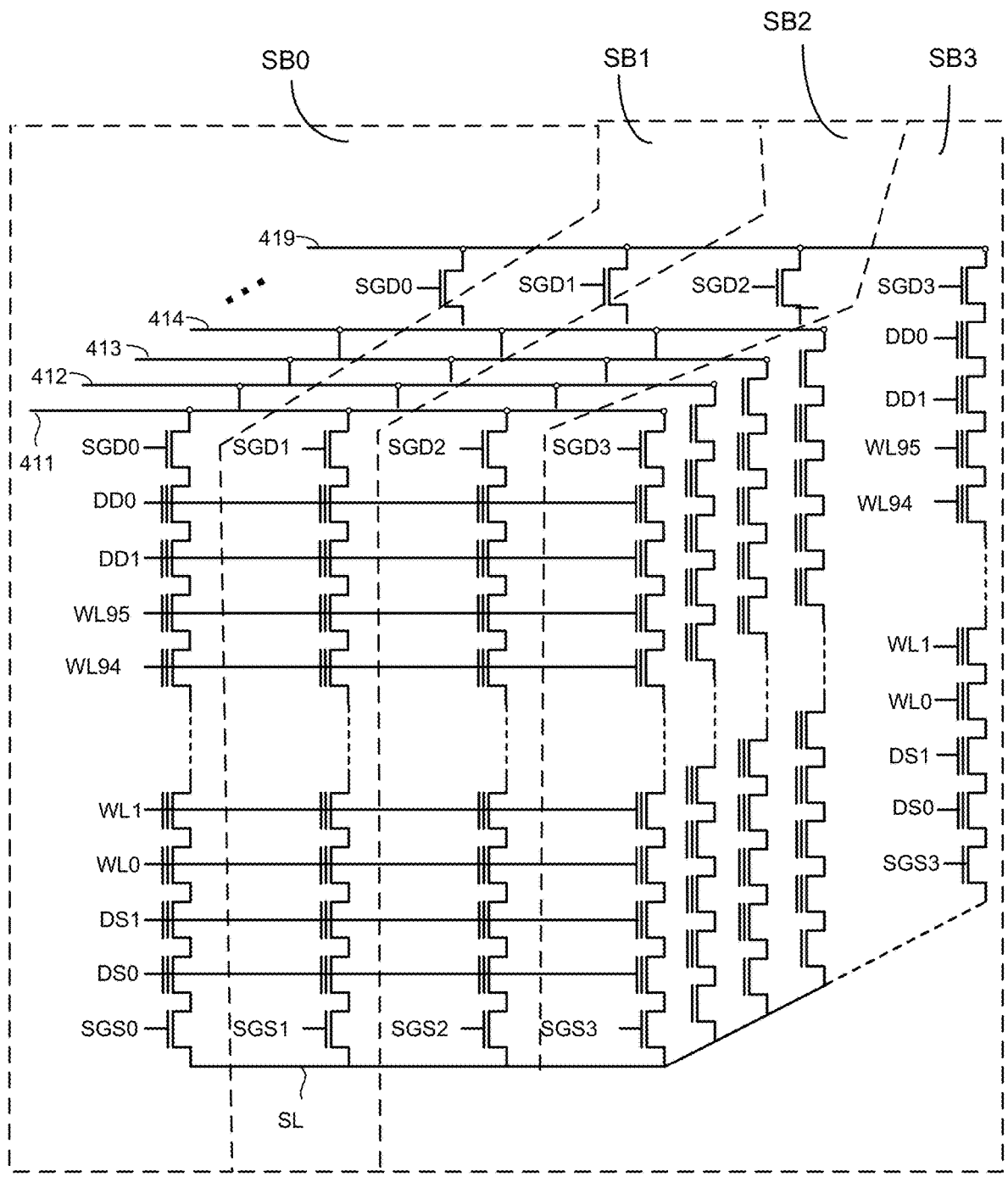
FIG. 4F is a schematic of a plurality of NAND strings showing multiple sub-blocks.

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, ... 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4F is a three dimensional memory structure that includes vertical NAND strings with charge-trapping material, other (2D and 3D) memory structures can also be used with the technology described herein.

Figures 5, 6:
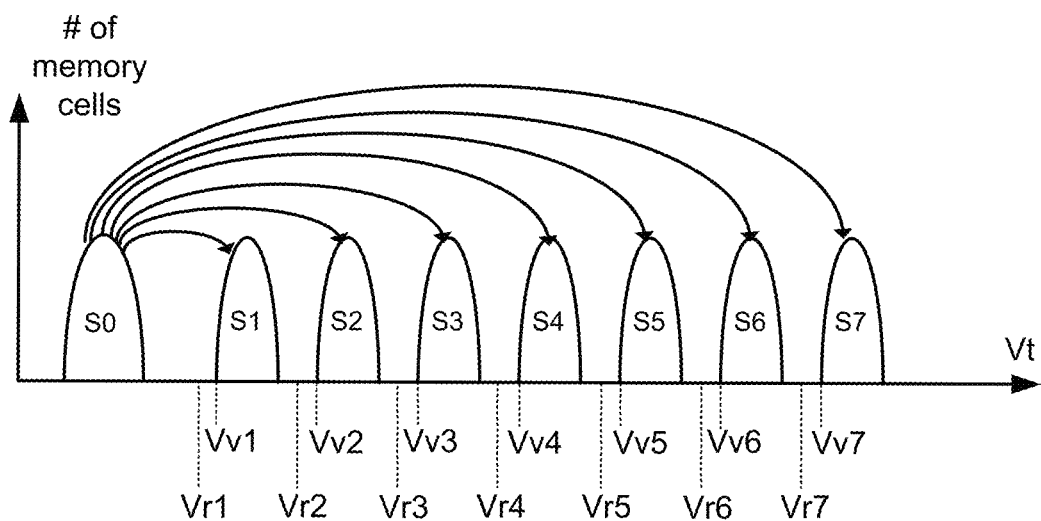
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, ... ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 6 is a table describing one example of an assignment of data values to data states. In the table of FIG. 6, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

As discussed above, it is possible that memory cells can become over programmed. For example, consider the example of a memory cell intended to be programmed to data state S4. The programming process is designed to increase the threshold voltage of the memory cell from the threshold voltage distribution for data state S0 to data S4 by applying a programming signal as a set of programming pulses that increase in magnitude by a step size and testing between program pulses as to whether the memory cell's threshold voltage has reached Vv4. However, due to a structural variation or increase in programming speed due to program/erase cycling, it is possible that when the memory cell's threshold voltage has reached Vv4 it has also surpassed Vr5, which may lead to an error when reading the memory cell later. This is one example of over programming. If a small number of memory cells become over programmed, the ECC process during reading may be able to correct the errors. However, if too many memory cells are over programmed or have errors, then the ECC may not be able to correct all of the errors and the reading process may fail, resulting in loss of data.

To prevent loss of data, it is proposed that the non-volatile storage system include a mechanism to compensate for over programming during the programming process. That is, after the programming process starts for a set of data and target memory cells and prior to the programming process completing for the set of data and the target memory cells, the system determines whether there is more than a threshold number of over programmed memory cells and, if so, then the system adjusts the programming process mid-way through the programming process (e.g., in-flight) to compensate for the over programming that has occurred so far in the currently being performed programming process.

Figure 7A:
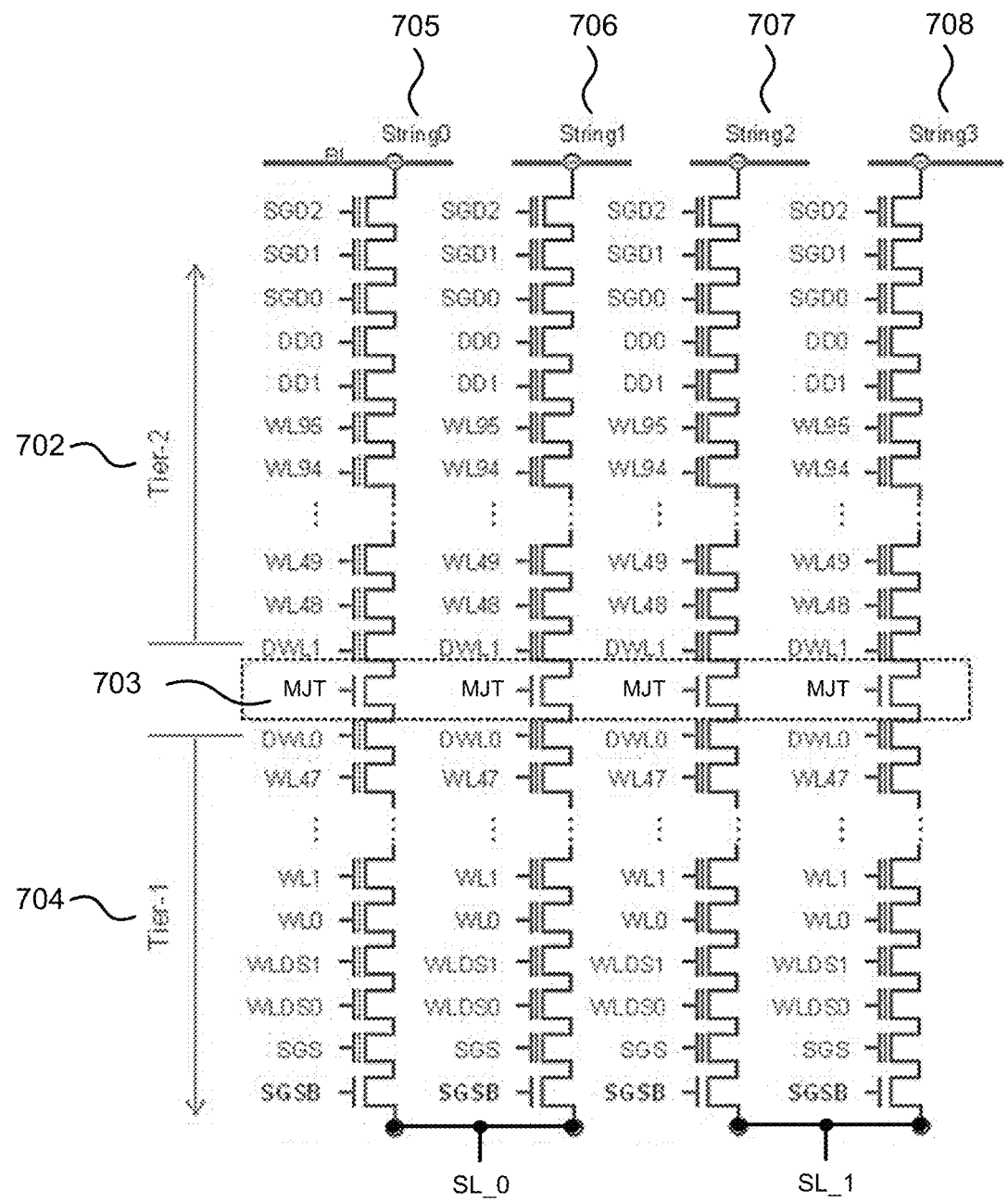
FIG. 7A depicts one embodiment of four NAND strings.

FIG. 7A depicts one embodiment of four NAND strings 705-708. Each of the NAND strings comprises a first portion of the NAND string (e.g., corresponding with a first tier of memory cell transistors 704), a second portion of the NAND string (e.g., corresponding with a second tier of memory cell transistors 702), and a tier select gate transistor 703 arranged between the first portion of the NAND string and the second portion of the NAND string. The tier select gate transistor 703 may comprise an NMOS transistor without a charge trap layer between the channel of the NMOS transistor and the gate of the NMOS transistor.

In some embodiments, the electrical isolation between the two tiers of memory cell transistors may be performed by biasing the dummy word lines DWL1 and DWL0 instead of setting a dedicated tier select gate transistor into a non-conducting state (e.g., the tier select gate transistors may be removed or omitted from the NAND strings). The first portion of the NAND string includes memory cell transistors corresponding with word lines WL0-WL47, a memory cell transistor connected to dummy word line DWL0 that is arranged between the tier select gate transistor 703 and the memory cell transistor connected to word line WL47, the memory cell transistors connected to dummy word lines WLDS1 and WLDS0 on the source-side and arranged between the memory cell transistor connected to word line WL0 and the source-side select gate that is controlled by the source-side select gate line SGS, and the source-side select gates controlled by source-side select gate lines SGS and SGSB. The second portion of the NAND string includes memory cell transistors corresponding with word lines WL48-WL95, a memory cell transistor connected to dummy word line DWL1 and arranged between the tier select gate transistor 703 and the memory cell transistor connected to word line WL48, the memory cell transistors connected to dummy word lines DD1 and DD0 on the drain-side and arranged between the memory cell transistor connected to word line WL95 and the drain-side select gate connected to SGD0, and the drain-side select gates controlled by SGD0-SGD2. As depicted in FIG. 7A, the source line SL_0 comprises the source-side connections to NAND strings 705-706 and the source line SL_1 comprises the source-side connections to NAND strings 707-708. The source line SL_0 may correspond with a first buried source line and the source line SL_1 may correspond with a second buried source line that is electrically isolated from the first buried source line.

Figure 7B:
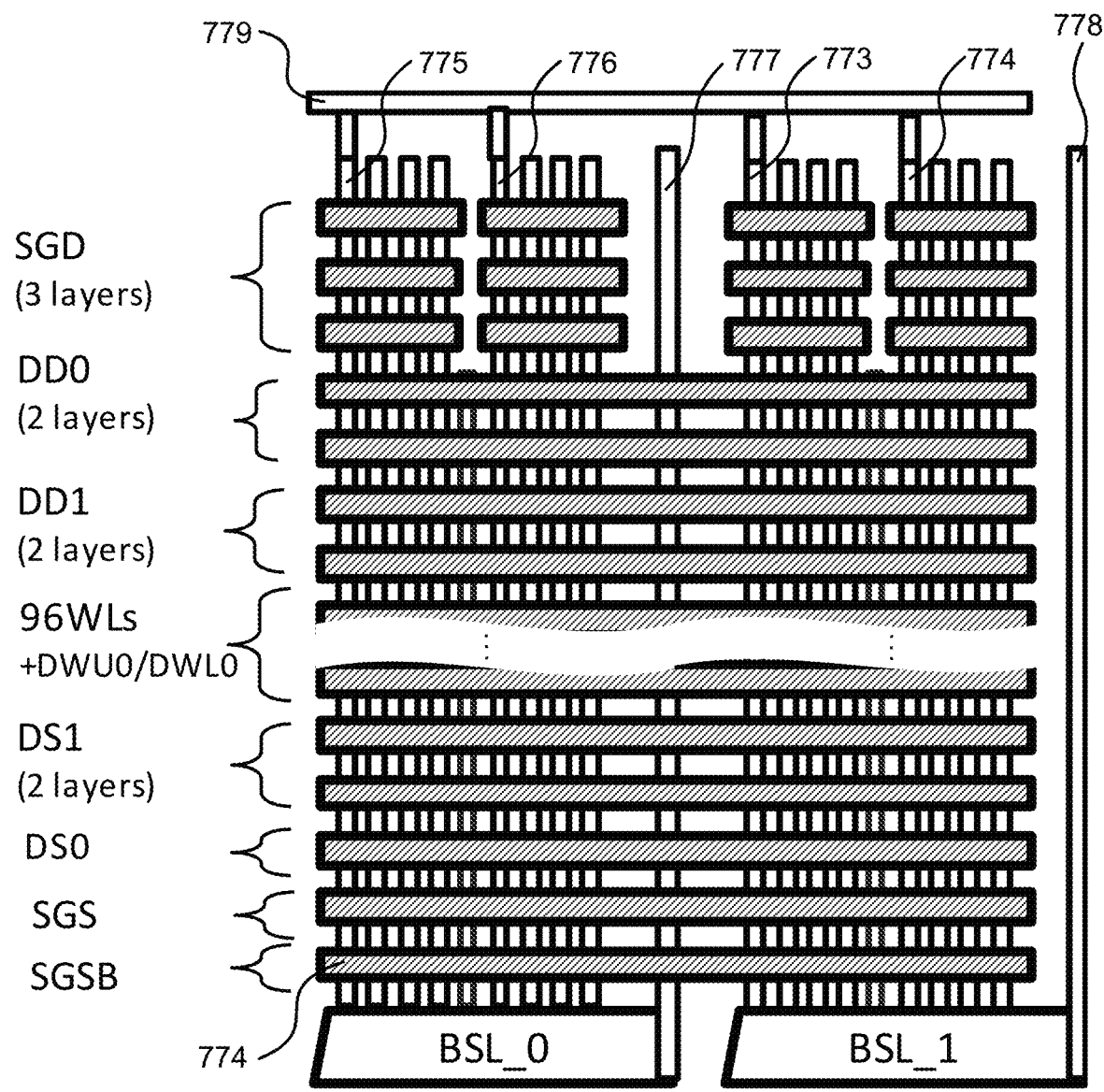
FIG. 7B depicts one embodiment of a NAND structure that includes four groups of NAND strings.

FIG. 7B depicts one embodiment of a NAND structure that includes four groups of NAND strings. Each of the four groups of NAND strings comprises four NAND strings. A first group of NAND strings includes a first NAND string 775 and a second group of NAND strings includes a second NAND string 776. A third group of NAND strings includes a third NAND string 773 and a fourth group of NAND strings includes a fourth NAND string 774. As depicted, a bit line 779 connects to the first NAND string 775, the second NAND string 776, the third NAND string 773, and the fourth NAND string 774. The first NAND string 775 includes three drain-side select gate transistors corresponding with the three SGD drain-side select gate lines, four drain-side dummy word line transistors corresponding with the DD0 and DD1 lines, 96 memory cell transistors corresponding with the 96 word lines, dummy word line transistors that are positioned in the middle of the 96 memory cell transistors to isolate a top tier of 48 memory cell transistors from a bottom tier of 48 memory cell transistors and that are driven by the DWU0 and DWL0 lines (the DWU0 and DWL0 lines may correspond with DWL1 and DWL0 in FIG. 7A with the tier select gate transistor 703 omitted), three source-side dummy word line transistors corresponding with the DS1 and DS0 lines, and two source-side select gate transistors corresponding with the source-side select gate lines SGS and SGSB. Both the first NAND string 775 and the second NAND string 776 connect to the buried source line BSL_0. Both the third NAND string 773 and the fourth NAND string 774 connect to the buried source line BSL_1. The buried source line BSL_0 may be biased to a first voltage (e.g., to an erase voltage) via a first source line connection 777 and the buried source line BSL_1 may be biased via a second source line connection 778 to a second voltage (e.g., to 0V) different from the first voltage. In some cases, such as during a read operation, both the first source line connection 777 and the second source line connection 778 may be biased to the same voltage. As depicted, the source-side select gate lines SGS and SGSB extend across all four groups of NAND strings.

Figure 7C:
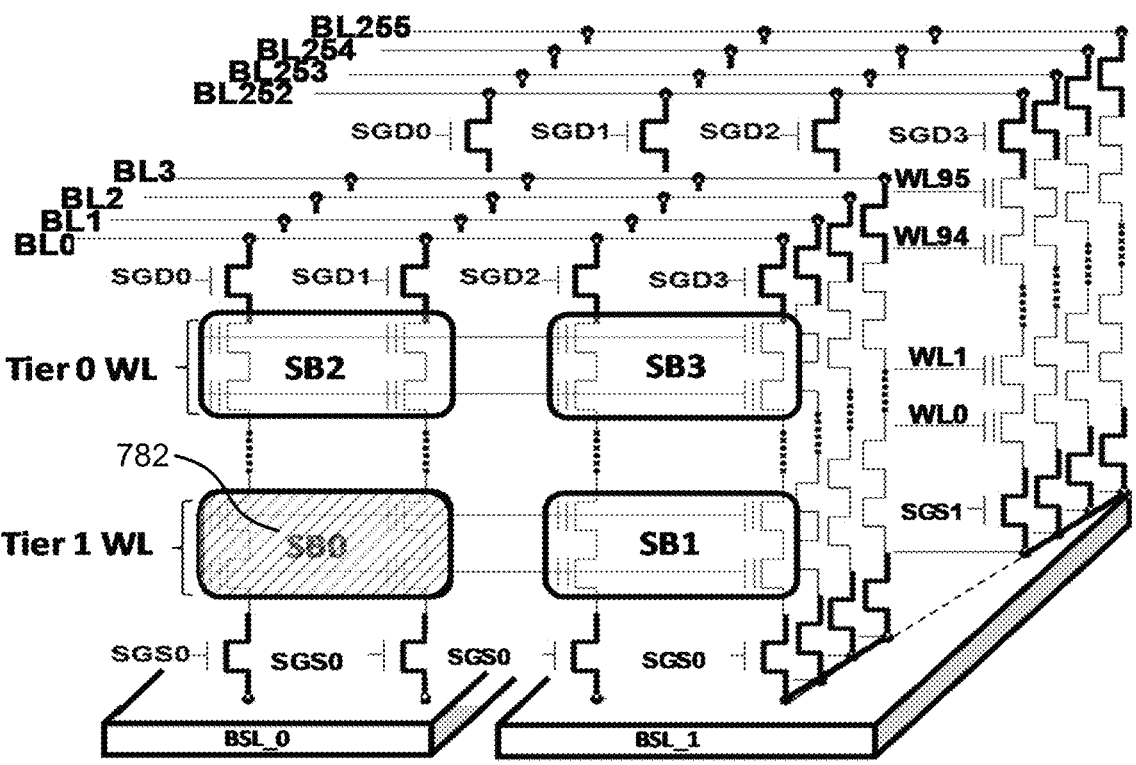
FIGS. 7C-7H depict various embodiments of a physical memory block that includes four sub-blocks.

FIG. 7C depicts one embodiment of a physical memory block that includes four sub-blocks SB0-SB3. During a memory operation, the sub-block SB0 782 may be selected, while the sub-blocks SB1-SB3 are unselected. In one example, an erase operation for erasing memory cell transistors within the sub-block SB0 782 may be performed while the sub-blocks SB1-SB3 are unselected and the memory cell transistors within the sub-blocks SB1-SB3 are not erased during the erase operation. As depicted, a first NAND string has a drain-side select gate controlled by the drain-side select gate line SGD0 and a source-side select gate controlled by the source-side select gate line SGS0, a second NAND string has a drain-side select gate controlled by the drain-side select gate line SGD1 and a source-side select gate controlled by the source-side select gate line SGS0, a third NAND string has a drain-side select gate controlled by the drain-side select gate line SGD2 and a source-side select gate controlled by the source-side select gate line SGS0, and a fourth NAND string has a drain-side select gate controlled by the drain-side select gate line SGD3 and a source-side select gate controlled by the source-side select gate line SGS0. The first NAND string and the second NAND string are connected to a first buried source line BSL_0. The third NAND string and the fourth NAND string are connected to a second buried source line BSL_1. A bit line BL0 connects to the four drain-side select gates driven by drain-side select gate lines SGD0-SGD3. In one embodiment, the first NAND string may correspond with the first NAND string 775 in FIG. 7B and the second NAND string may correspond with the second NAND string 776 in FIG. 7B.

Figure 7D:
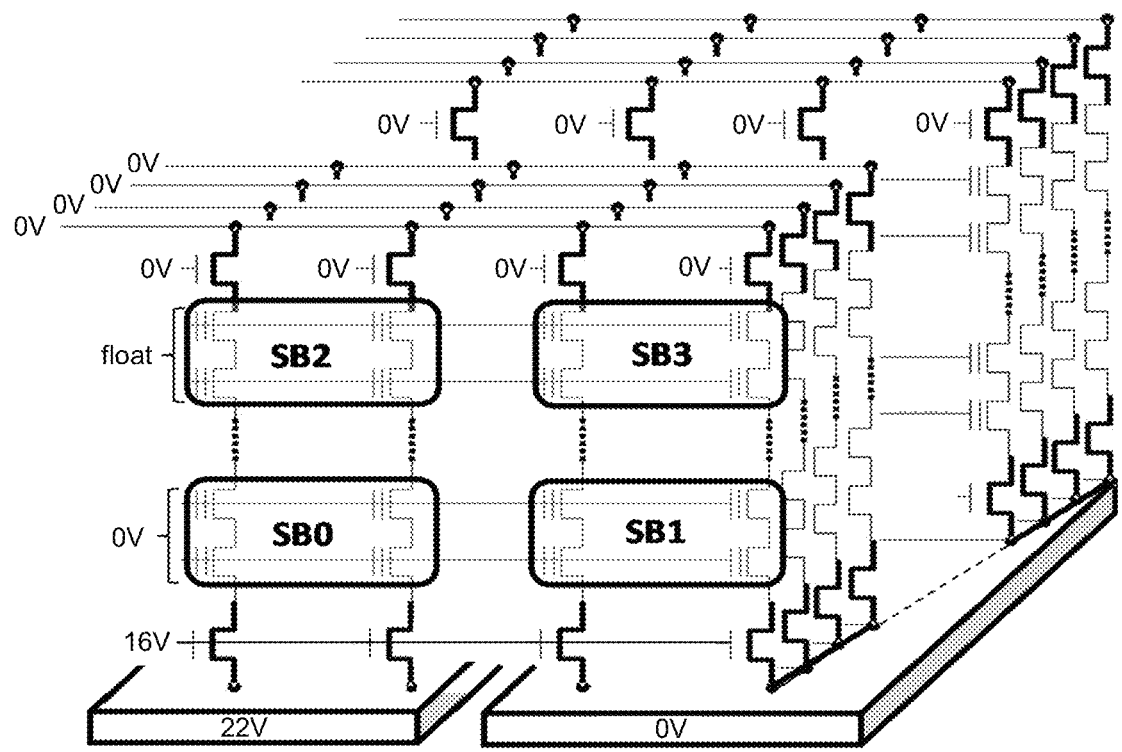

FIG. 7D depicts one embodiment of the physical memory block of FIG. 7C during an erase operation for the sub-block SB0. As depicted, the bit lines that include bit line BL0 have been set to 0V, the drain-side select gate lines SGD0-SGD3 have been set to 0V, the word lines connecting to the gates of the memory cell transistors within the sub-blocks SB2 and SB3 have been floated, the word lines connecting to the gates of the memory cell transistors within the sub-blocks SB0 and SB1 have been set to 0V, the source-side select gate line SGS0 has been set to 16V, the first buried source line BSL_0 has been set to an erase voltage of 22V, and the second buried source line BSL_1 has been set to 0V. With these bias conditions, the memory cell transistors within the sub-block SB0 may be set into an erased state, while the memory cell transistors within the sub-blocks SB1-SB3 are unselected and not erased.

Figure 7E:
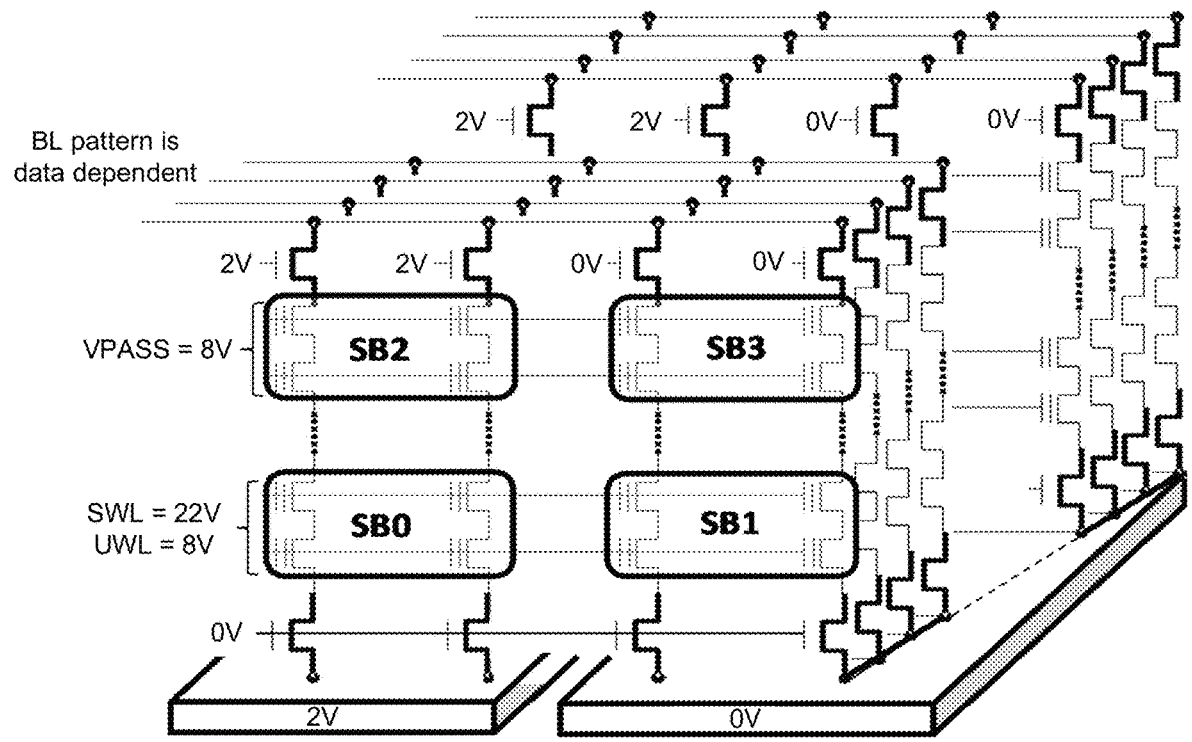

FIG. 7E depicts one embodiment of the physical memory block of FIG. 7C during a programming operation for the sub-block SB0. As depicted, the bit lines that include bit line BL0 have been set to 0V or 2V depending on whether a memory cell transistor that is electrically connected to the bit line is to be programmed or program-inhibited (the bit line pattern is therefore data dependent), the drain-side select gate lines SGD0-SGD1 have been set to 2V, the drain-side select gate lines SGD2-SGD3 have been set to 0V, the word lines connecting to the gates of the memory cell transistors within the sub-blocks SB2 and SB3 have been set to a pass voltage of 8V, the unselected word lines (UWLs) connecting to the gates of the unselected memory cell transistors within the sub-blocks SB0 and SB1 have been set to the pass voltage of 8V, the selected word line (SWL) connecting to the gates of the selected memory cell transistors within the sub-blocks SB0 and SB1 has been set to the programming voltage of 22V, the source-side select gate line SGS0 has been set to 0V, the first buried source line BSL_0 has been set to 2V, and the second buried source line BSL_1 has been set to 0V. With these bias conditions, the memory cell transistors within the sub-block SB0 that are selected for programming may be set into a programmed data state, while the memory cell transistors within the sub-blocks SB1-SB3 are unselected and not programmed.

Figure 7F:
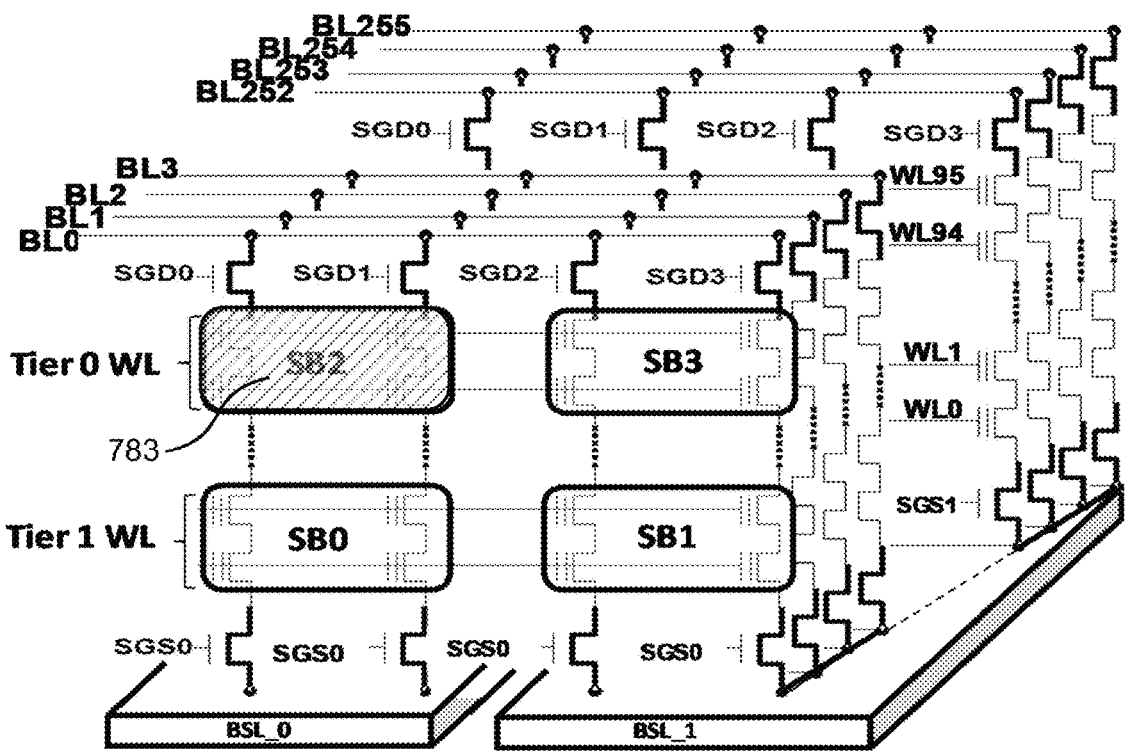

FIG. 7F depicts one embodiment of a physical memory block that includes four sub-blocks SB0-SB3. During a memory operation, the sub-block SB2 783 may be selected, while the sub-blocks SB0-SB1 and SB3 are unselected. In one example, an erase operation for erasing memory cell transistors within the sub-block SB2 783 may be performed while the sub-blocks SB0-SB1 and SB3 are unselected and the memory cell transistors within the sub-blocks SB0-SB1 and SB3 are not erased during the erase operation. As depicted, a first NAND string has a drain-side select gate controlled by the drain-side select gate line SGD0 and a source-side select gate controlled by the source-side select gate line SGS0, a second NAND string has a drain-side select gate controlled by the drain-side select gate line SGD1 and a source-side select gate controlled by the source-side select gate line SGS0, a third NAND string has a drain-side select gate controlled by the drain-side select gate line SGD2 and a source-side select gate controlled by the source-side select gate line SGS0, and a fourth NAND string has a drain-side select gate controlled by the drain-side select gate line SGD3 and a source-side select gate controlled by the source-side select gate line SGS0. The first NAND string and the second NAND string are connected to a first buried source line BSL_0. The third NAND string and the fourth NAND string are connected to a second buried source line BSL_1. A bit line BL0 connects to the four drain-side select gates driven by drain-side select gate lines SGD0-SGD3. In one embodiment, the first NAND string may correspond with the first NAND string 775 in FIG. 7B and the second NAND string may correspond with the second NAND string 776 in FIG. 7B.

Figure 7G:
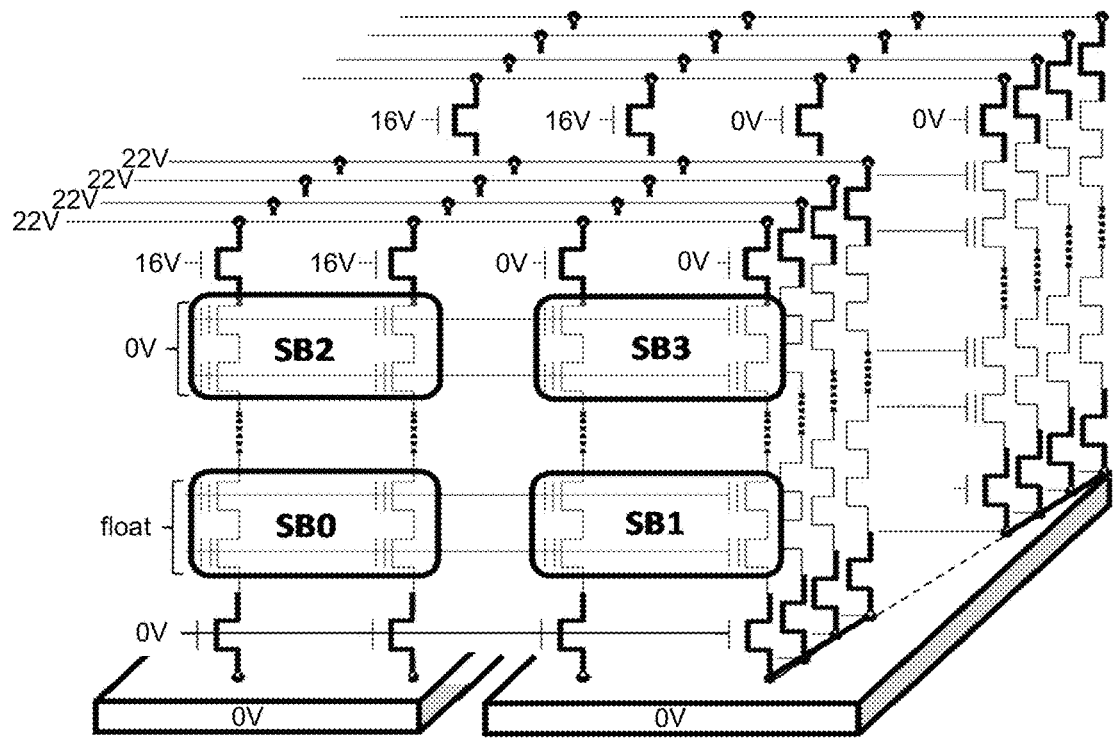

FIG. 7G depicts one embodiment of the physical memory block of FIG. 7F during an erase operation for the sub-block SB2. As depicted, the bit lines that include bit line BL0 have been set to an erase voltage of 22V, the drain-side select gate lines SGD0-SGD1 have been set to 16V, the drain-side select gate lines SGD2-SGD3 have been set to 0V, the word lines connecting to the gates of the memory cell transistors within the sub-blocks SB2 and SB3 have been set to 0V, the word lines connecting to the gates of the memory cell transistors within the sub-blocks SB0 and SB1 have been floated, the source-side select gate line SGS0 has been set to 0V, the first buried source line BSL_0 has been set to 0V, and the second buried source line BSL_1 has been set to 0V. With these bias conditions, the memory cell transistors within the sub-block SB2 may be set into an erased state, while the memory cell transistors within the sub-blocks SB0-SB1 and SB3 are unselected and not erased.

Figure 7H:
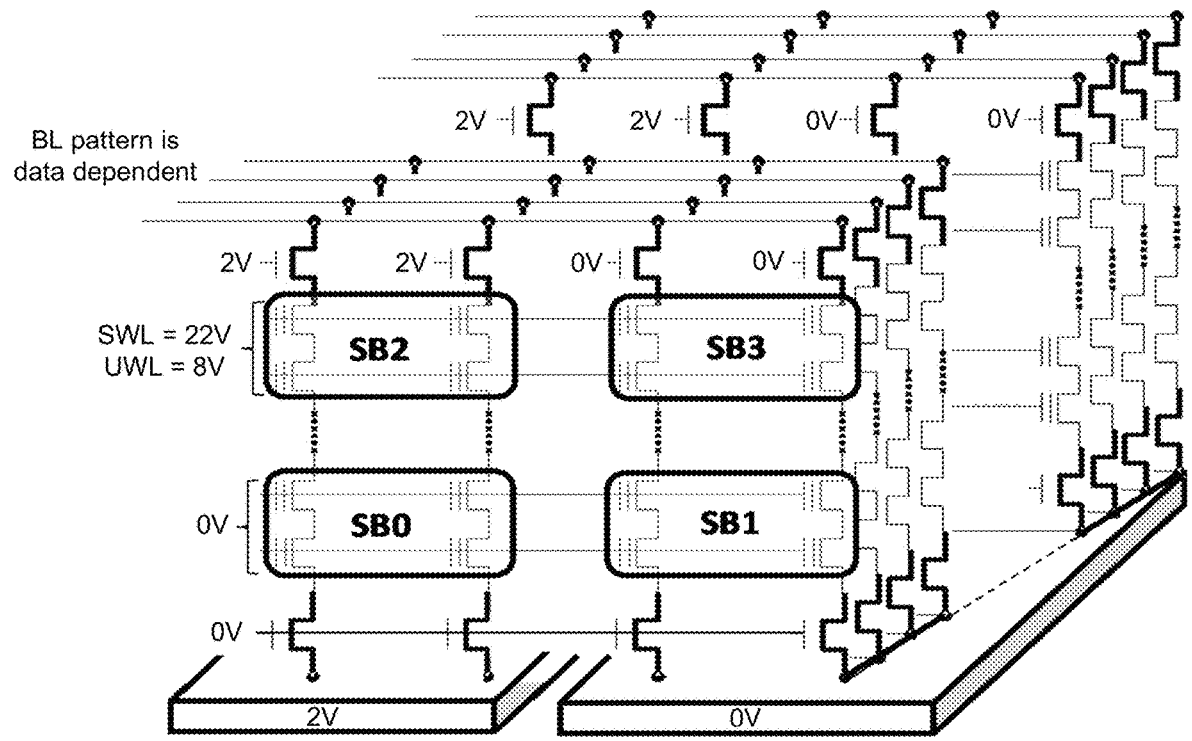

FIG. 7H depicts one embodiment of the physical memory block of FIG. 7F during a programming operation for the sub-block SB2. As depicted, the bit lines that include bit line BL0 have been set to 0V or 2V depending on whether a memory cell transistor that is electrically connected to the bit line is to be programmed or program-inhibited. A memory cell transistor that is program-inhibited is prevented from being programmed. The applied bit line voltages to the bit lines during the programming operation is dependent on the data pattern to be programmed. As depicted in FIG. 7H, the drain-side select gate lines SGD0-SGD1 have been set to 2V, the drain-side select gate lines SGD2-SGD3 have been set to 0V, the unselected word lines (UWLs) connecting to the gates of the unselected memory cell transistors within the sub-blocks SB2 and SB3 have been set to the pass voltage of 8V, the selected word line (SWL) connecting to the gates of the selected memory cell transistors within the sub-blocks SB2 and SB3 has been set to the programming voltage of 22V, the word lines connecting to the gates of the memory cell transistors within the sub-blocks SB0 and SB1 have been set to an unselected voltage of 0V, the source-side select gate line SGS0 has been set to 0V, the first buried source line BSL_0 has been set to 2V, and the second buried source line BSL_1 has been set to 0V. With these bias conditions, the memory cell transistors within the sub-block SB2 that are selected for programming may be set into a programmed data state, while the memory cell transistors within the sub-blocks SB0-SB1 and SB3 are unselected and not programmed.

Figure 8A:
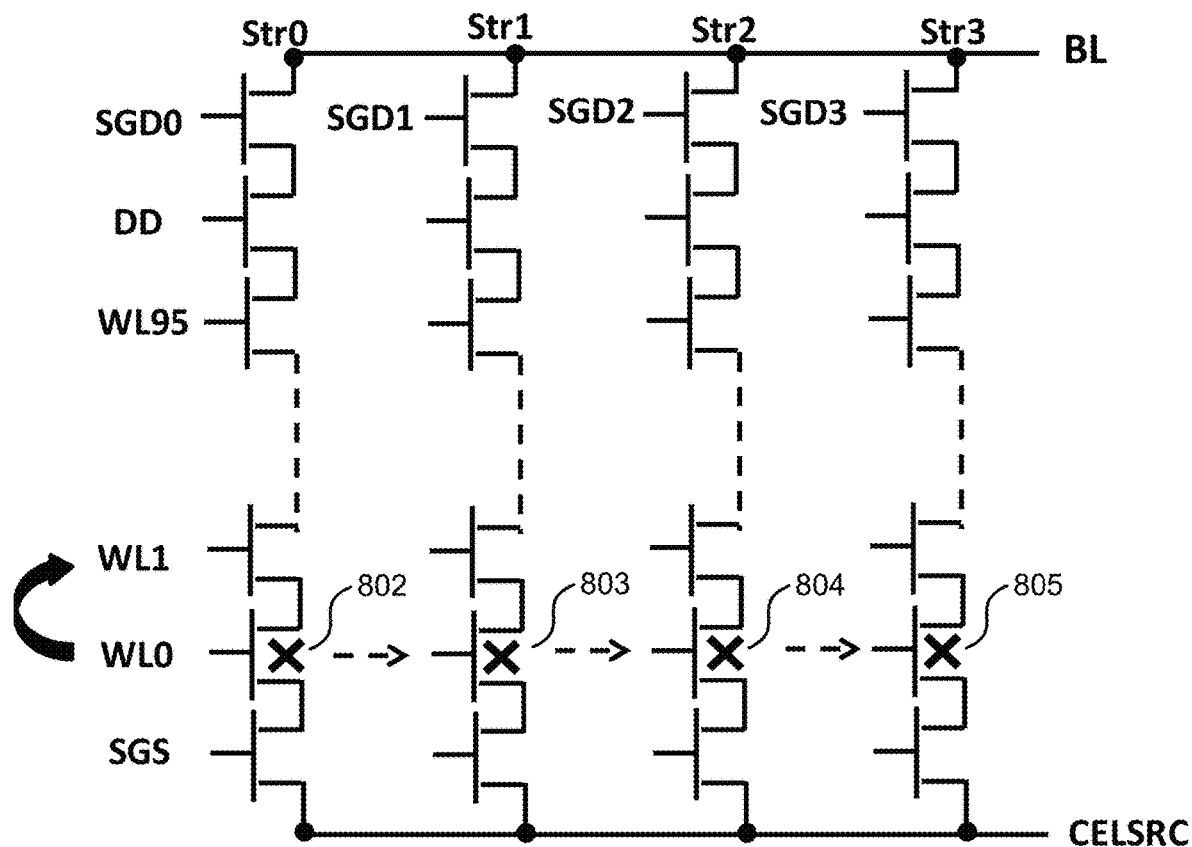
FIG. 8A depicts one embodiment of a memory array that comprises four NAND strings.

FIG. 8A depicts one embodiment of a memory array that comprises four NAND strings. As depicted, the NAND string Str0 has a drain-side select gate that is controlled by the drain-side select gate line SGD0, the NAND string Str1 has a drain-side select gate that is controlled by the drain-side select gate line SGD1, the NAND string Str2 has a drain-side select gate that is controlled by the drain-side select gate line SGD2, and the NAND string Str3 has a drain-side select gate that is controlled by the drain-side select gate line SGD3. The drain-side select gates for the four NAND strings connect to a bit line BL. The NAND strings include 96 memory cell transistors in series corresponding with word lines WL0 through WL95. The source-side select gates for the four NAND strings are controlled by the source-side select gate line SGS and connect to the source line CELSRC.

During a programming operation for programming memory cells connected to the word line WL0, the selected word line WL0 will be biased to a selected word line voltage (e.g., 22V) and the unselected word lines WL1 through WL95 will be biased to the pass voltage (e.g., 8V). The drain-side select gates controlled by SGD0 through SGD3 may select one of the NAND strings by setting the drain-side select gate for the selected string into a conducting state while the other three drain-side select gates are set into a non-conducting state. For example, to program memory cell 802, the drain-side select gate controlled by SGD0 may be set into a conducting state while the selected word line WL0 is biased to the selected word line voltage and the unselected word lines WL1 through WL95 are biased to the pass voltage. The order of programming the memory cells 802-805 may be to program memory cell 802 first, then memory cell 803, then memory cell 804, and finally memory cell 805. After the memory cells 802-805 associated with word line WL0 have been programmed, the memory cells associated with the next word line to be programmed (e.g., word line WL1) may be programmed.

Figure 8B:
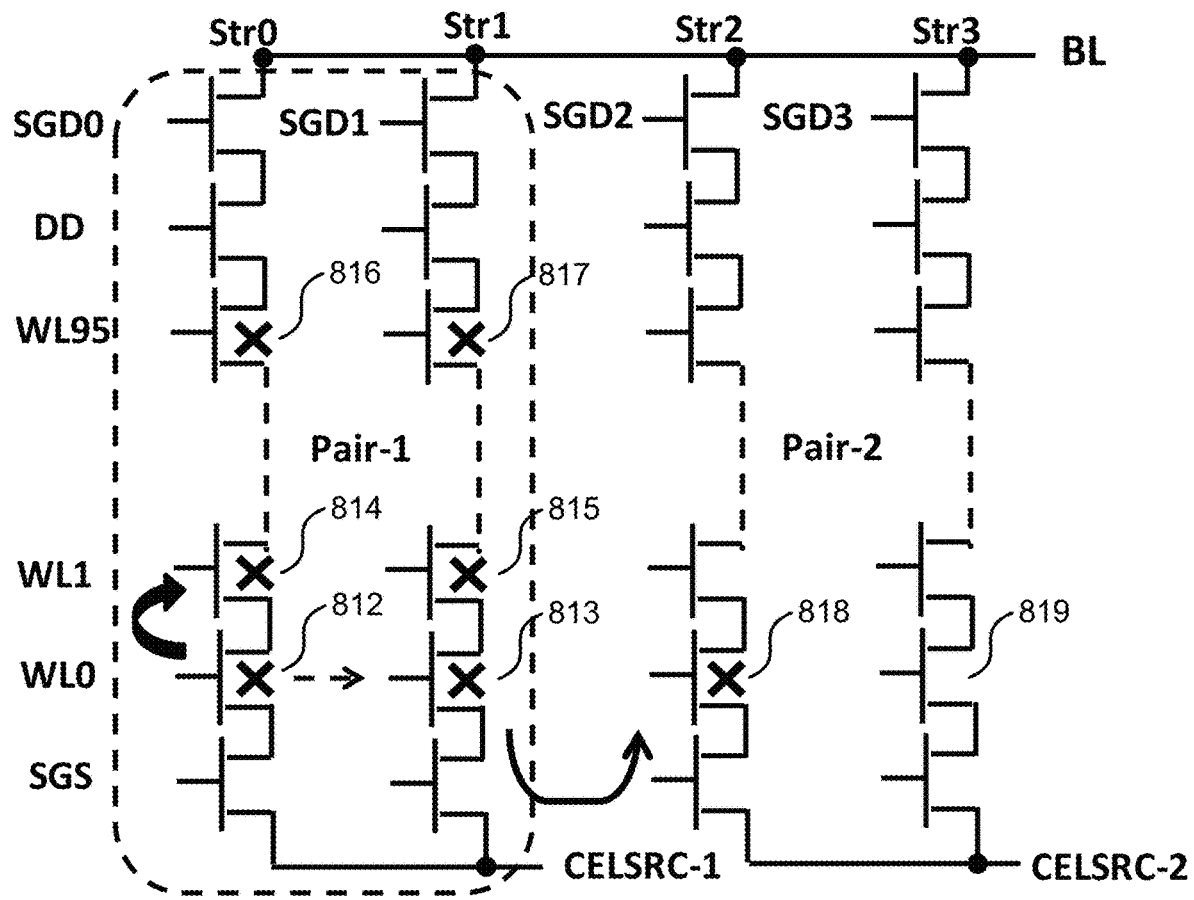
FIG. 8B depicts one embodiment of a memory array that comprises two sets of NAND strings.

FIG. 8B depicts one embodiment of a memory array that comprises two sets of NAND strings. The first set of NAND strings Pair-1 is connected to a first source line CELSRC-1 and the second set of NAND strings Pair-2 is connected to a second source line CELSRC-2 that is different from and electrically distinguishable from the first source line CELSRC-1. The first source line CELSRC-1 may be driven by a first source line driver and the second source line CELSRC-2 may be driven by a second source line driver. As depicted, the first set of NAND strings Pair-1 includes the NAND string Str0 with a drain-side select gate that is controlled by the drain-side select gate line SGD0 and the NAND string Str1 with a drain-side select gate that is controlled by the drain-side select gate line SGD1. The second set of NAND strings Pair-2 includes the NAND string Str2 with a drain-side select gate that is controlled by the drain-side select gate line SGD2 and the NAND string Str3 with a drain-side select gate that is controlled by the drain-side select gate line SGD3. The drain-side select gates for the four NAND strings Str0 through Str3 connect to the bit line BL. Each of the NAND strings include 96 memory cell transistors in series corresponding with word lines WL0 through WL95. The source-side select gates for the first set of NAND strings Pair-1 are connected to the first source line CELSRC-1 and the source-side select gates for the second set of NAND strings Pair-2 are connected to the second source line CELSRC-2.

During a programming operation for programming memory cells connected to the word line WL0 within the first set of NAND strings Pair-1, the selected word line WL0 will be biased to a selected word line voltage (e.g., 22V) and the unselected word lines WL1 through WL95 will be biased to a first pass voltage (e.g., 8V). The drain-side select gates controlled by SGD0 through SGD3 may select one of the NAND strings within the first set of NAND strings in order to program either the memory cell 812 or the memory cell 813. After memory cells 812-813 within the first set of NAND strings Pair-1 have been programmed, the memory cells 814-815 associated with the next word line WL1 are programmed next, and then finally the memory cells 816-817 associated with word line WL95 are programmed. After the memory cells 812-817 of the first set of NAND strings Pair-1 have been programmed, a programming operation for programming memory cells within the second set of NAND strings Pair-2 may be performed.

During a programming operation for programming memory cells connected to the word line WL0 within the second set of NAND strings Pair-2, the selected word line WL0 will be biased to the selected word line voltage (e.g., 22V) and the unselected word lines WL1 through WL95 will be biased to a second pass voltage (e.g., 10V) that is greater than the first pass voltage that was applied when the memory cells 812-817 within the first set of NAND strings were programmed. The elevated pass voltage during the programming operation for programming memory cells 818-819 within the second set of NAND strings Pair-2 may reduce the amount of program disturb occurring to the memory cells 812-817 within the first set of NAND strings. In one example, to program memory cell 818, the drain-side select gate controlled by SGD2 may be set into a conducting state while the selected word line WL0 is biased to the selected word line voltage and the unselected word lines WL1 through WL95 are biased to the second pass voltage. Prior to programming memory cell 819, the drain-side select gate controlled by SGD3 may be set into a conducting state, the drain-side select gates controlled by SGD0-SGD2 may be set into non-conducting states, the source-side select gates may be set into non-conducting states (e.g., by biasing their source-side select gate lines to 0V), the selected word line WL0 may be biased to the selected word line voltage, and the unselected word lines WL1 through WL95 may be biased to the second pass voltage (e.g., 10V) that is greater than the first pass voltage (e.g., 9V).

Figure 8C:
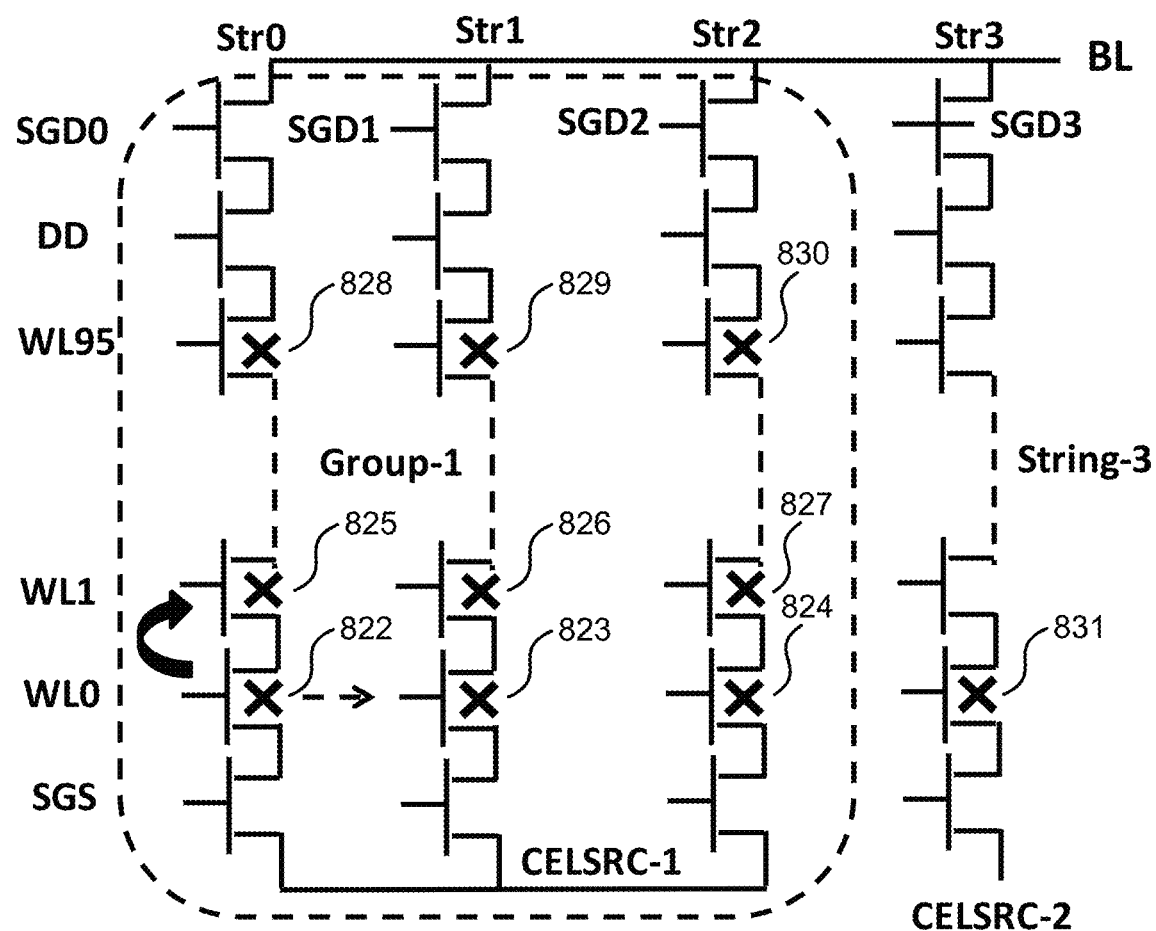
FIG. 8C depicts another embodiment of a memory array that comprises two sets of NAND strings.

FIG. 8C depicts another embodiment of a memory array that comprises two sets of NAND strings. The first set of NAND strings Group-1 is connected to a first source line CELSRC-1 and the second set of NAND strings String-3 is connected to a second source line CELSRC-2 that is different from and/or electrically distinguishable from the first source line CELSRC-1. The first source line CELSRC-1 may be driven by a first source line driver and the second source line CELSRC-2 may be driven by a second source line driver. In some cases, an analog multiplexor may be used to select which source line driver drives the source-side end of a particular NAND string.

As depicted in FIG. 8C, the first set of NAND strings Group-1 comprises three NAND strings comprising the NAND string Str0 with a drain-side select gate that is controlled by the drain-side select gate line SGD0, the NAND string Str1 with a drain-side select gate that is controlled by the drain-side select gate line SGD1, and the NAND string Str2 with a drain-side select gate that is controlled by the drain-side select gate line SGD2. The second set of NAND strings String-3 includes only the NAND string Str3 with a drain-side select gate that is controlled by the drain-side select gate line SGD3. The drain-side select gates for the four NAND strings Str0 through Str3 connect to the bit line BL. Each of the NAND strings include 96 memory cell transistors in series corresponding with word lines WL0 through WL95. The source-side select gates for the first set of NAND strings Group-1 are connected to the first source line CELSRC-1 and the source-side select gate for the second set of NAND strings String-3 is connected to the second source line CELSRC-2.

During a programming operation for programming memory cells connected to the word line WL0 within the first set of NAND strings Group-1, the selected word line WL0 will be biased to a selected word line voltage (e.g., 22V) and the unselected word lines WL1 through WL95 will be biased to a first pass voltage (e.g., 8V). The drain-side select gates controlled by SGD0 through SGD3 may select one of the NAND strings within the first set of NAND strings in order to program either the memory cell 822, the memory cell 823, or the memory cell 824. After memory cells 822-824 within the first set of NAND strings Group-1 have been programmed, the memory cells 825-827 associated with the next word line WL1 are programmed next, and then finally the memory cells 828-830 associated with word line WL95 are programmed. After the memory cells 822-830 of the first set of NAND strings Group-1 have been programmed, a programming operation for programming memory cells within the second set of NAND strings String-3 may be performed.

During a programming operation for programming memory cell 831 connected to the word line WL0 within the second set of NAND strings String-3, the selected word line WL0 may be biased to the selected word line voltage (e.g., 22V) and the unselected word lines WL1 through WL95 may be biased to a second pass voltage (e.g., 9V) that is greater than the first pass voltage that was applied when the memory cells 822-830 within the first set of NAND strings were previously programmed. In some cases, as the number of strings within the second set of NAND strings decreases, the amount of voltage increase in the pass voltage may also decrease. For example, if the number of NAND strings within the second set of NAND strings comprises two NAND strings, then the pass voltage applied may be increased by 2V; however, if the number of NAND strings within the second set of NAND strings comprises only one NAND string, then the pass voltage applied may be increased by 1V.

In some cases, the first set of NAND strings may comprise two or more NAND strings. In one example, the first set of NAND strings may comprise five NAND strings. In another example, the first set of NAND strings may comprise 16 NAND strings.

Figure 8D:
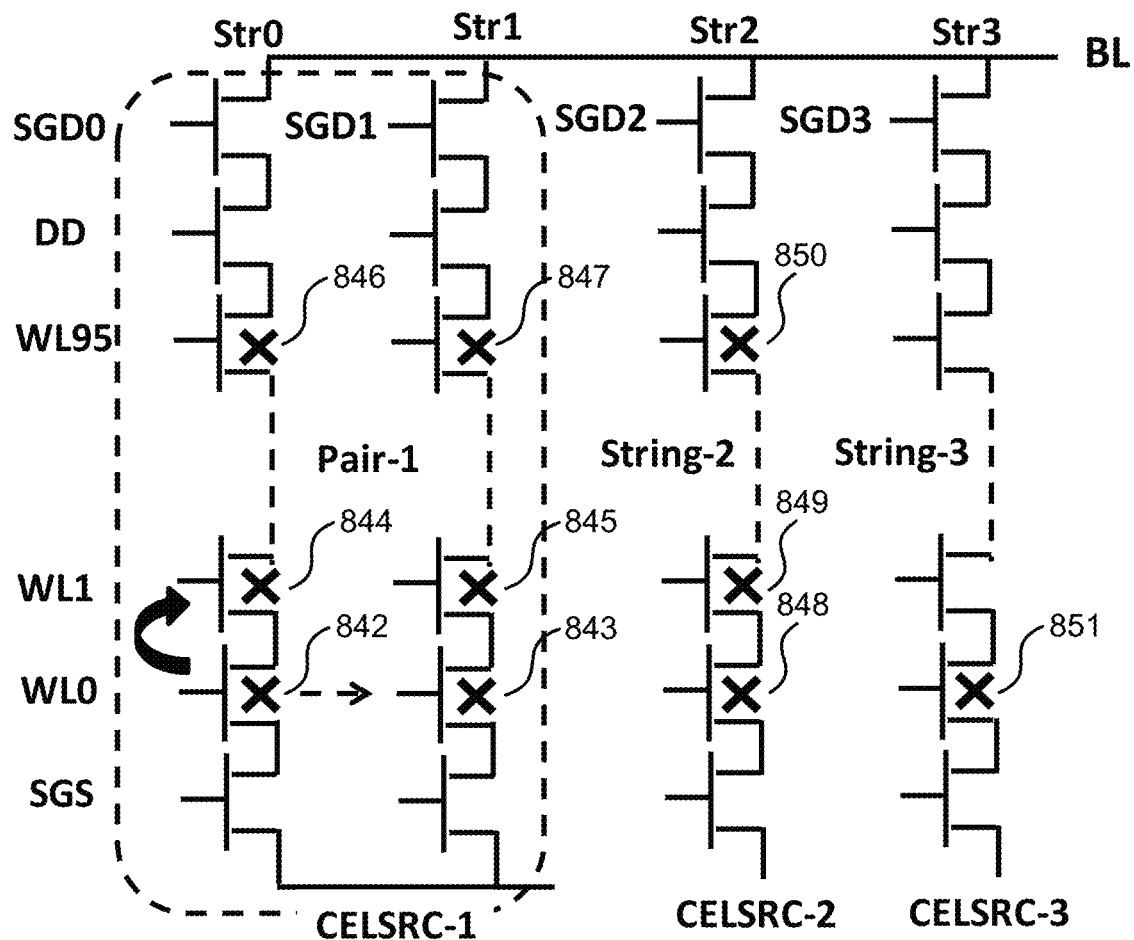
FIG. 8D depicts one embodiment of a memory array that comprises three sets of NAND strings.

FIG. 8D depicts one embodiment of a memory array that comprises three sets of NAND strings. The first set of NAND strings Pair-1 is connected to a first source line CELSRC-1, the second set of NAND strings String-2 is connected to a second source line CELSRC-2 that may be biased independent of the first source line CELSRC-1, and the third set of NAND strings String-3 is connected to a third source line CELSRC-3 that may be biased independent of the first source line CELSRC-1 and the second source line CELSRC-2. The first source line CELSRC-1 may be driven by a first source line driver, the second source line CELSRC-2 may be driven by a second source line driver, and the third source line CELSRC-3 may be driven by a third source line driver.

During a programming operation for programming memory cells connected to the word line WL0 within the first set of NAND strings Pair-1, the selected word line WL0 may be set to a selected word line voltage (e.g., 22V) and the unselected word lines WL1 through WL95 may be set to a first pass voltage (e.g., 8V). The drain-side select gates controlled by SGD0 through SGD3 may select one of the NAND strings within the first set of NAND strings in order to program either the memory cell 842 or the memory cell 843. After memory cells 842-843 within the first set of NAND strings have been programmed, the memory cells 844-845 associated with the next word line WL1 towards the drain-side may be programmed, and then the memory cells 846-847 associated with word line WL95 closest to the bit line may be programmed. After the memory cells 842-847 of the first set of NAND strings have been programmed, a programming operation for programming memory cells within the second set of NAND strings may be performed.

During a second programming operation for programming memory cells 848-850 within the second set of NAND strings the selected word line WL0 may be biased to the selected word line voltage (e.g., 22V) and the unselected word lines WL1 through WL95 may be biased to a second pass voltage (e.g., 9V) that is greater than the first pass voltage that was applied when the memory cells 842-847 within the first set of NAND strings were previously programmed. Subsequently, during a third programming operation for programming memory cells, such as memory cell 851, within the third set of NAND strings the selected word line WL0 may be biased to the selected word line voltage (e.g., 22V) and the unselected word lines WL1 through WL95 may be biased to a third pass voltage (e.g., 10V) that is greater than the second pass voltage that was applied when the memory cells 848-850 within the second set of NAND strings were previously programmed.

Figure 9A:
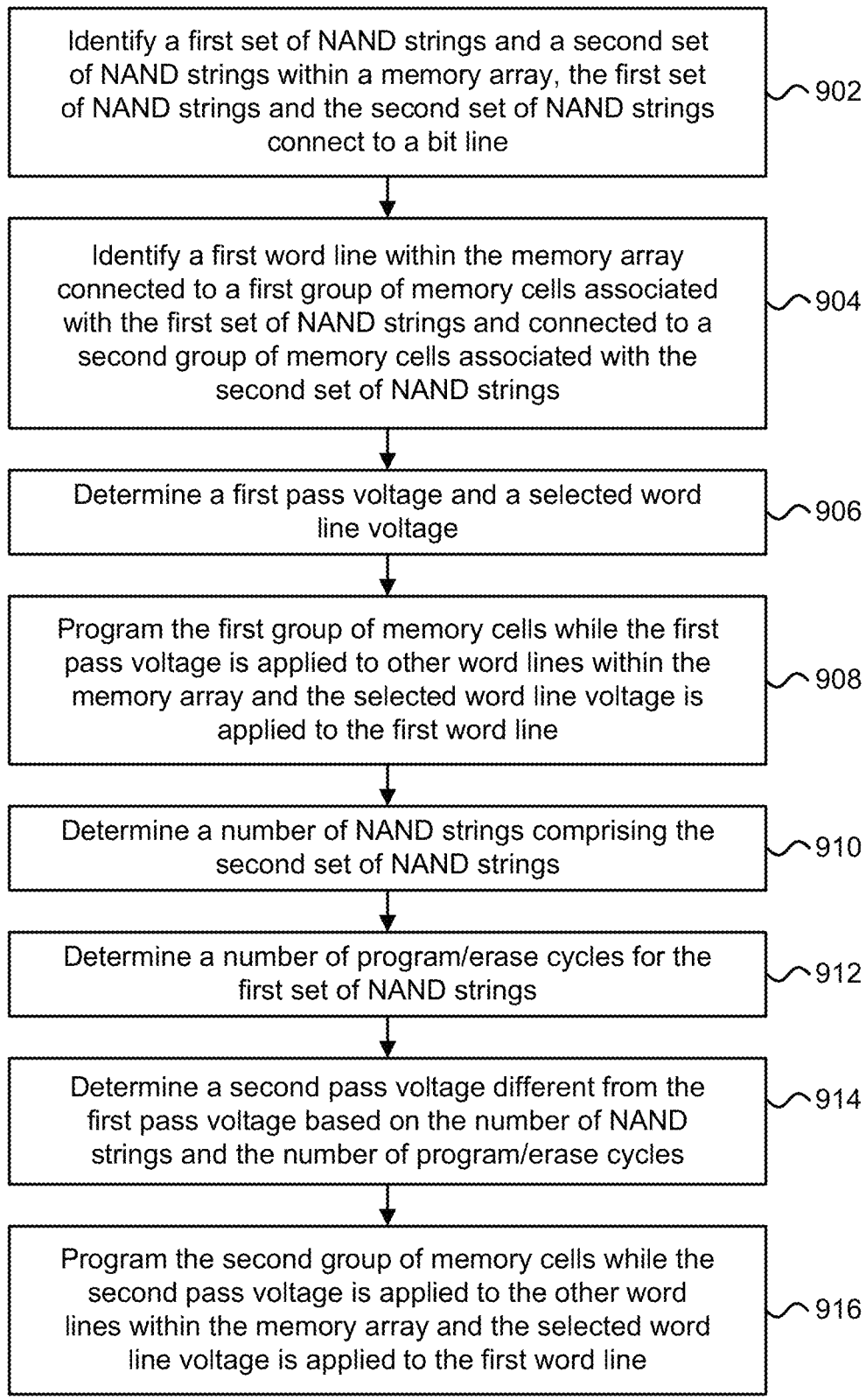
FIG. 9A is a flowchart describing one embodiment of a process for programming memory cells within a memory array.

FIG. 9A is a flowchart describing one embodiment of a process for programming memory cells within a memory array. The memory array may correspond with the memory structure 326 in FIG. 2. In one embodiment, the process of FIG. 9A may be performed by control circuitry, such as control circuitry 310 depicted in FIG. 2. In another embodiment, the process of FIG. 9A may be performed by one or more control circuits, such as controller 120 in FIG. 1.

In step 902, a first set of NAND strings and a second set of NAND strings are identified within a memory array. The first set of NAND strings and the second set of NAND strings are connected to a bit line. In one example, the first set of NAND strings may comprise three NAND strings, such as the first set of NAND strings Group-1 depicted in FIG. 8C, and the second set of NAND strings may comprise one NAND string, such as the second set of NAND strings String-3 depicted in FIG. 8C. Each of the NAND strings within the first set of NAND strings and the second set of NAND strings may be connected to the bit line via drain-side select gates. In step 904, a first word line within the memory array connected to a first group of memory cells associated with the first set of NAND strings and connected to a second group of memory cells associated with the second set of NAND strings is identified. In one example, the first word line may correspond with word line WL1 in FIG. 8C.

In step 906, a first pass voltage and a selected word line voltage are determined. The first pass voltage and the selected word line voltage may be determined via a lookup table stored in non-volatile memory. The first pass voltage and the selected word line voltage may be determined based on a word line position within the memory array. In step 908, the first group of memory cells is programmed while the first pass voltage is applied to other word lines within the memory array (e.g., word lines WL2 through WL95) and the selected word line voltage is applied to the first word line (e.g., word line WL1). In one example, the first pass voltage (e.g., 9V) may be applied to word lines WL2 through WL95 in FIG. 8C and the selected word line voltage (e.g., 22V) may be applied to word line WL1 in FIG. 8C.

In step 910, a number of NAND strings comprising the second set of NAND strings is determined. In step 912, a number of program/erase cycles for the first set of NAND strings is determined. In some cases, as the number of program/erase cycles for the first set of NAND strings increases, the second pass voltage may increase as well. In one example, if the number of program/erase cycles for the first set of NAND strings is greater than a threshold number of program/erase cycles (e.g., is greater than five), then the second pass voltage may be set to 10V; however, if the number of program/erase cycles for the first set of NAND strings is not greater than the threshold number of program/erase cycles, then the second pass voltage may be set to 9V.

In step 914, a second pass voltage different from the first pass voltage is determined based on the number of NAND strings for the second set of NAND strings and/or the number of program/erase cycles for the first set of NAND strings. The second pass voltage may be greater than the first pass voltage. In step 916, the second group of memory cells is programmed while the second pass voltage is applied to the other word lines within the memory array and the selected word line voltage is applied to the first word line. In one example, the second group of memory cells may comprise memory cell 831 in FIG. 8C, the second pass voltage (e.g., 10V) may be applied to word lines WL1-WL95 in FIG. 8C, and the selected word line voltage (e.g., 22V) may be applied to word line WL0 in FIG. 8C.

Figure 9B:
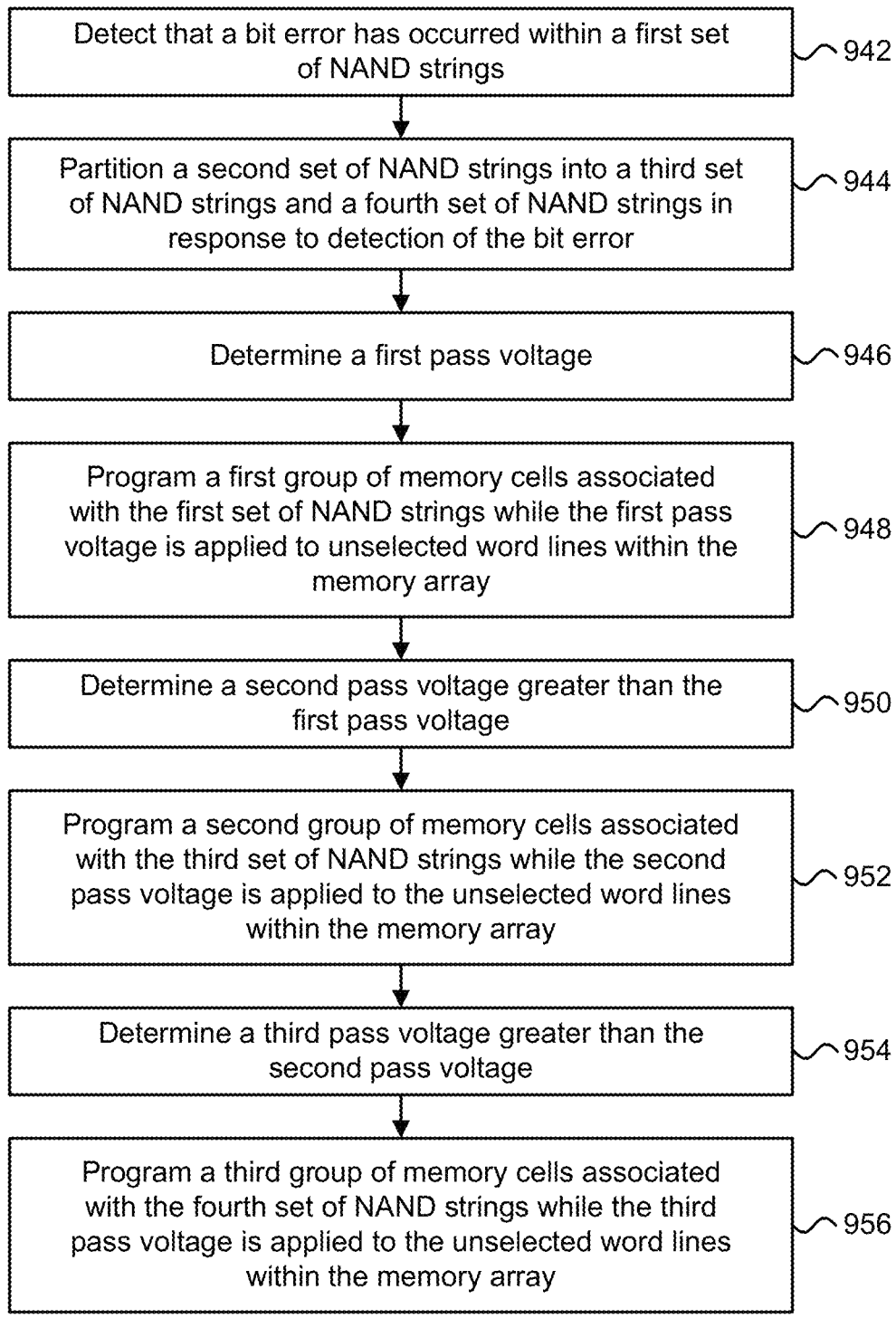
FIG. 9B is a flowchart describing an alternative embodiment of a process for programming memory cells within a memory array.

FIG. 9B is a flowchart describing an alternative embodiment of a process for programming memory cells within a memory array. The memory array may correspond with the memory structure 326 in FIG. 2. In one embodiment, the process of FIG. 9B may be performed by control circuitry, such as control circuitry 310 depicted in FIG. 2. In another embodiment, the process of FIG. 9B may be performed by one or more control circuits, such as controller 120 in FIG. 1.

In step 942, it is detected that a bit error has occurred within a first set of NAND strings. The bit error may correspond with an ECC error that was detected within data stored using the first set of NAND strings. In step 944, a second set of NAND strings is partitioned into a third set of NAND strings and a fourth set of NAND strings in response to detection of the bit error. In one example, the two sets of NAND strings depicted in FIG. 8C may be partitioned to create the three sets of NAND strings depicted in FIG. 8C. In another example, the second set of NAND strings Pair-2 depicted in FIG. 8B may be partitioned to create two sets of NAND strings, such as String-2 and String-3 in FIG. 8D.

In step 946, a first pass voltage is determined. The first pass voltage may be determined via a lookup table stored in non-volatile memory. In step 948, a first group of memory cells associated with the first set of NAND strings is programmed while the first pass voltage is applied to unselected word lines within the memory array. In step 950, a second pass voltage greater than the first pass voltage is determined. The second pass voltage may be identified via a lookup table stored in non-volatile memory. The second pass voltage may depend on a number of program/erase cycles for the first group of memory cells and/or the number of NAND strings comprising the third set of NAND strings. In step 952, a second group of memory cells associated with a third set of NAND strings is programmed while the second pass voltage is applied to the unselected word lines within the memory array. In step 954, a third pass voltage greater than the second pass voltage is determined. In step 956, a third group of memory cells associated with the fourth set of NAND strings is programmed while the third pass voltage is applied to the unselected word lines within the memory array. In one example, the first group of memory cells may correspond with memory cells 842-843 in FIG. 8D, the second group of memory cells may correspond with memory cell 848 in FIG. 8D, the third group of memory cells may correspond with memory cell 851 in FIG. 8D, the unselected word lines within the memory array may correspond with the word lines WL1 through WL95 in FIG. 8D, the first pass voltage may comprise 8V, the second pass voltage may comprise 9V, and the third pass voltage may comprise 10V.

One embodiment of the disclosed technology includes a memory array and one or more control circuits in communication with the memory array. The memory array including a first set of NAND strings and a second set of NAND strings. The first set of NAND strings connects to a first source line and the second set of NAND strings connects to a second source line. The one or more control circuits configured to identify a first word line within the memory array connected to a first group of memory cells associated with the first set of NAND strings and connected to a second group of memory cells associated with the second set of NAND strings. The one or more control circuits configured to determine a first pass voltage and a second pass voltage different from the first pass voltage. The one or more control circuits configured to cause the first group of memory cells to be programmed while the first pass voltage is applied to other word lines different from the first word line within the memory array and cause the second group of memory cells to be programmed while the second pass voltage is applied to the other word lines within the memory array.

One embodiment of the disclosed technology includes identifying a first word line within a memory array. The memory array includes a first set of NAND strings and a second set of NAND strings. The first set of NAND strings connects to a first source line and the second set of NAND strings connects to a second source line. The first word line connects to a first group of memory cells within the first set of NAND strings and connects to a second group of memory cells within the second set of NAND strings. The method further comprises determining a first pass voltage, programming the first group of memory cells while the first pass voltage is applied to other word lines different from the first word line within the memory array, determining a total number of NAND strings for the second set of NAND strings, determining a second pass voltage based on the total number of NAND strings for the second set of NAND strings, and programming the second group of memory cells while the second pass voltage is applied to the other word lines different from the first word line within the memory array.

One embodiment of the disclosed technology includes a memory array and one or more control circuits in communication with the memory array. The memory array including a first set of NAND strings and a second set of NAND strings. The first set of NAND strings connects to a first source line and the second set of NAND strings connects to a second source line. The one or more control circuits configured to determine a first pass voltage and program a first set of data into the first set of NAND strings while the first pass voltage is applied to other word lines within the memory array. The one or more control circuits configured to detect that a bit error has occurred within the first set of data stored within the first set of NAND strings and partition the second set of NAND strings into a third set of NAND strings and a fourth set of NAND strings in response to detection of the bit error. The one or more control circuits configured to determine a second pass voltage and a third pass voltage greater than the second pass voltage. The one or more control circuits configured to program a third set of data into the third set of NAND strings while the second pass voltage is applied to the other word lines within the memory array and program a fourth set of data into the fourth set of NAND strings while the third pass voltage is applied to the other word lines within the memory array.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

Two devices may be "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:

a memory array including a first set of NAND strings and a second set of NAND strings, the first set of NAND strings and the second set of NAND strings are connected to a common bit line, the first set of NAND strings includes a first NAND string with a first drain-side select gate and the second set of NAND strings includes a second NAND string with a second drain-side select gate, the first set of NAND strings connects to a first source line and the second set of NAND strings connects to a second source line; and one or more control circuits in communication with the memory array, the one or more control circuits configured to identify a first word line within the memory array connected to a first group of memory cells associated with the first set of NAND strings and connected to a second group of memory cells associated with the second set of NAND strings, the one or more control circuits configured to determine a first pass voltage and a second pass voltage different from the first pass voltage, the one or more control circuits configured to cause the first group of memory cells to be programmed while the first pass voltage is applied to other word lines different from the first word line within the memory array, the one or more control circuits configured to set the first drain-side select gate into a conducting state and the second drain-side select gate into a non-conducting state during programming of the first group of memory cells, the one or more control circuits configured to cause the second group of memory cells to be programmed while the second pass voltage is applied to the other word lines within the memory array, the one or more control circuits configured to set the first drain-side select gate into the non-conducting state and the second drain-side select gate into the conducting state during programming of the second group of memory cells.

2. The apparatus of claim 1, wherein:

the one or more control circuits configured to determine a number of NAND strings comprising the second set of NAND strings and determine the second pass voltage based on the number of NAND strings comprising the second set of NAND strings.

3. The apparatus of claim 1, wherein:

the one or more control circuits configured to determine a number of program/erase cycles for the first set of NAND strings and determine the second pass voltage based on the number of program/erase cycles for the first set of NAND strings.

4. The apparatus of claim 1, wherein:

the one or more control circuits configured to determine a selected word line voltage, the one or more control circuits configured to cause the first group of memory cells to be programmed while the selected word line voltage is applied to the first word line and cause the second group of memory cells to be programmed while the selected word line voltage is applied to the first word line.

5. The apparatus of claim 1, wherein:
the second pass voltage is greater than the first pass voltage.

6. The apparatus of claim 1, wherein:
the first NAND string includes a source-side select gate, a source of the source-side select gate connects to the first source line and a drain of the drain-side select gate connects to the common bit line.

7. The apparatus of claim 1, wherein:
the one or more control circuits configured to partition the second set of NAND strings into a third set of NAND strings and a fourth set of NAND strings.

8. The apparatus of claim 7, wherein:
the one or more control circuits configured to determine a third pass voltage greater than the second pass voltage and cause a third group of memory cells associated with the fourth set of NAND strings to be programmed while the third pass voltages is applied to the other word lines within the memory array.

9. The apparatus of claim 1, wherein:
the first set of NAND strings and the second set of NAND strings comprise vertical NAND strings.

10. The apparatus of claim 2, wherein:
the number of NAND strings comprising the second set of NAND strings is greater than eight NAND strings.

11. A method, comprising:
identifying a first word line within a memory array, the memory array includes a first set of NAND strings and a second set of NAND strings, the first set of NAND strings connects to a first source line and the second set of NAND strings connects to a second source line, the first word line connects to a first group of memory cells within the first set of NAND strings and connects to a second group of memory cells within the second set of NAND strings, the first set of NAND strings includes a first NAND string with a first drain-side select gate and the second set of NAND strings includes a second NAND string with a second drain-side select gate;
determining a first pass voltage;
programming the first group of memory cells while the first pass voltage is applied to other word lines different from the first word line within the memory array, the programming the first group of memory cells includes setting the first drain-side select gate into a conducting state and the second drain-side select gate into a non-conducting state;
determining a total number of NAND strings for the second set of NAND strings;
determining a second pass voltage based on the total number of NAND strings for the second set of NAND strings; and
programming the second group of memory cells while the second pass voltage is applied to the other word lines different from the first word line within the memory array, the programming the second group of memory cells includes setting the first drain-side select gate into the non-conducting state and the second drain-side select gate into the conducting state.

12. The method of claim 11, wherein:
the second pass voltage is greater than the first pass voltage.

13. The method of claim 11, further comprising:
determining a number of program/erase cycles for the first set of NAND strings and determining the second pass voltage based on the number of program/erase cycles for the first set of NAND strings.

14. The method of claim 11, further comprising:
determining a selected word line voltage greater than the second pass voltage; and
programming the second group of memory cells while the second pass voltage is applied to the other word lines and the selected word line voltage is applied to the first word line.

15. The method of claim 11, wherein:
the first set of NAND strings and the second set of NAND strings are connected to a common bit line, the first NAND string includes a source-side select gate, a source of the source-side select gate connects to the first source line and a drain of the drain-side select gate connects to the common bit line.

16. An apparatus, comprising:
a memory array including a first set of NAND strings and a second set of NAND strings, the first set of NAND strings connects to a first source line and the second set of NAND strings connects to a second source line, the first set of NAND strings includes a first NAND string with a first drain-side select gate and the second set of NAND strings includes a second NAND string with a second drain-side select gate; and
one or more control circuits in communication with the memory array, the one or more control circuits configured to determine a first pass voltage and program a first set of data into the first set of NAND strings while the first pass voltage is applied to other word lines within the memory array, the one or more control circuits configured to set the first drain-side select gate into a conducting state and the second drain-side select gate into a non-conducting state during programming of the first set of data, the one or more control circuits configured to partition the second set of NAND strings into a third set of NAND strings and a fourth set of NAND strings, the one or more control circuits configured to determine a second pass voltage and a third pass voltage greater than the second pass voltage, the one or more control circuits configured to program a third set of data into the third set of NAND strings while the second pass voltage is applied to the other word lines within the memory array and program a fourth set of data into the fourth set of NAND strings while the third pass voltage is applied to the other word lines within the memory array, the one or more control circuits configured to set the first drain-side select gate into the non-conducting state and the second drain-side select gate into the conducting state during programming of the third set of data.

17. The apparatus of claim 16, wherein:
the one or more control circuits configured to determine a number of NAND strings comprising the third set of NAND strings and determine the second pass voltage based on the number of NAND strings comprising the third set of NAND strings.

18. The apparatus of claim 16, wherein:
the one or more control circuits configured to determine a number of program/erase cycles for the first set of NAND strings and determine the second pass voltage based on the number of program/erase cycles for the first set of NAND strings.

19. The apparatus of claim 16, wherein:
the one or more control circuits configured to determine a selected word line voltage and program the fourth set of data into the fourth set of NAND strings while the third pass voltage is applied to the other word lines within the memory array and the selected word line voltage is applied to a selected word line within the memory array.

20. The apparatus of claim 16, wherein:

the first set of NAND strings and the third set of NAND strings are connected to a common bit line, the first NAND string includes a source-side select gate, a source of the source-side select gate connects to the first source line and a drain of the drain-side select gate connects to the common bit line.

* * * * *